(12) United States Patent
Sakamoto et al.

(10) Patent No.: US 7,943,953 B2
(45) Date of Patent: May 17, 2011

(54) LIGHT EMITTING DEVICE AND LIGHT EMITTING MODULE

(75) Inventors: Daisuke Sakamoto, Higashiomi (JP); Mitsuo Yanagisawa, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 12/162,973

(22) PCT Filed: Jan. 31, 2007

(86) PCT No.: PCT/JP2007/051633
§ 371 (c)(1),
(2), (4) Date: May 12, 2009

(87) PCT Pub. No.: WO2007/088909
PCT Pub. Date: Aug. 9, 2007

(65) Prior Publication Data
US 2009/0224273 A1   Sep. 10, 2009

(30) Foreign Application Priority Data

Jan. 31, 2006 (JP) ............... P2006-023120
Mar. 31, 2006 (JP) ............... P2006-098079
Mar. 31, 2006 (JP) ............... P2006-098080

(51) Int. Cl.
*H01L 33/00* (2010.01)
(52) U.S. Cl. ............... 257/100; 257/E33.059
(58) Field of Classification Search ............ 257/100, 257/E33.059, E33.072
See application file for complete search history.

(56) References Cited

U.S. PATENT DOCUMENTS

2005/0194606 A1*  9/2005  Oohata ............ 257/99
2005/0205845 A1   9/2005  Delsing et al.
2005/0205876 A1   9/2005  Harada et al.
2005/0220414 A1   10/2005 Harada et al. ............ 385/49

(Continued)

FOREIGN PATENT DOCUMENTS

JP          63-052490           3/1988

(Continued)

OTHER PUBLICATIONS

Chinese language office action dated Jul. 27, 2010 and its English language translation for corresponding Chinese Appl. No. 2007/800041349.

(Continued)

*Primary Examiner* — Thomas L Dickey
(74) *Attorney, Agent, or Firm* — DLA Piper LLP (US)

(57) ABSTRACT

To provide a light emitting device and a light emitting module which can suppress deterioration caused by light emitted from a light emitting chip, even in the case of using a light emitting chip emitted light of which has a short wavelength and in which deterioration of emission brightness and the like does not easily occur even if used for a long period of time.

The device is characterized by including a container (20) which is formed of a transparent inorganic material and has a recessed opening, a light emitting chip (1) which is disposed in the recessed opening of the container (20) with a glass bonding member (4) interposed therebetween and in which a first conduction type layer (11), a light emitting layer (12), and a second conduction layer (13) are formed on a substrate (10), and a lid (21) which is formed of a transparent inorganic material and blocks the recessed opening of the container. The container (20) and the lid (21) are formed of quartz glass, optical glass containing boric acid and silicic acid, crystal, sapphire, fluorite or the like.

11 Claims, 22 Drawing Sheets

U.S. PATENT DOCUMENTS

| | | | |
|---|---|---|---|
| 2006/0163605 A1 | 7/2006 | Miyahara | |
| 2006/0237732 A1* | 10/2006 | Nagai et al. | 257/91 |
| 2006/0261364 A1* | 11/2006 | Suehiro et al. | 257/100 |
| 2006/0267032 A1* | 11/2006 | Diamantidis | 257/94 |
| 2007/0170458 A1 | 7/2007 | Mitani et al. | |

FOREIGN PATENT DOCUMENTS

| | | |
|---|---|---|
| JP | 05-175553 | 7/1993 |
| JP | 06-104488 | 4/1994 |
| JP | 07-297451 | 11/1995 |
| JP | 11-177129 | 7/1999 |
| JP | 2004-186173 | 7/2004 |
| JP | 2004-342732 | 12/2004 |
| JP | 2005-175039 | 6/2005 |
| JP | 2005/268708 A | 9/2005 |
| JP | 2005-294733 | 10/2005 |
| JP | 2005/294820 A | 10/2005 |
| JP | 2005/530917 A | 10/2005 |
| WO | WO 2004082036 A1 * | 9/2004 |

OTHER PUBLICATIONS

Japanese language office action dated Dec. 21, 2010 and its English language translation for corresponding Japanese Appl. No. 2006023120 lists the references above.

Japanese language office action dated Dec. 21, 2010 and its English language translation for corresponding Japanese Appl. No. 2006/098080 lists the references above.

Japanese language office action dated Jan. 11, 2011 and its English language translation for corresponding Japanese Appl. No. 2006/098079 lists the references above.

* cited by examiner

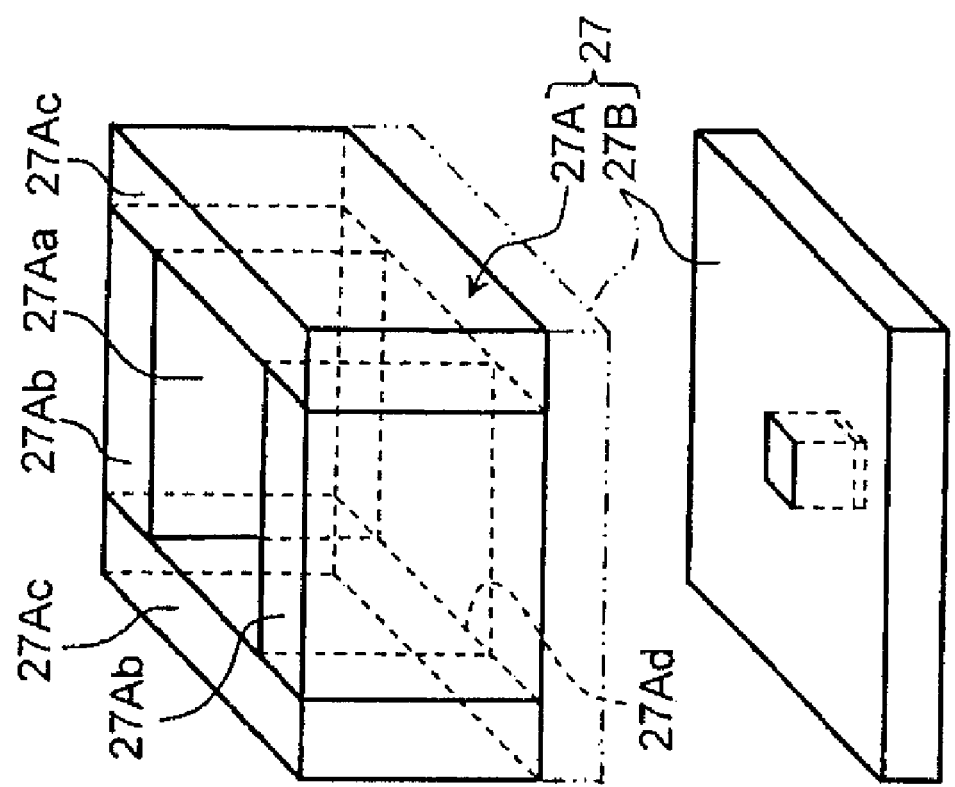
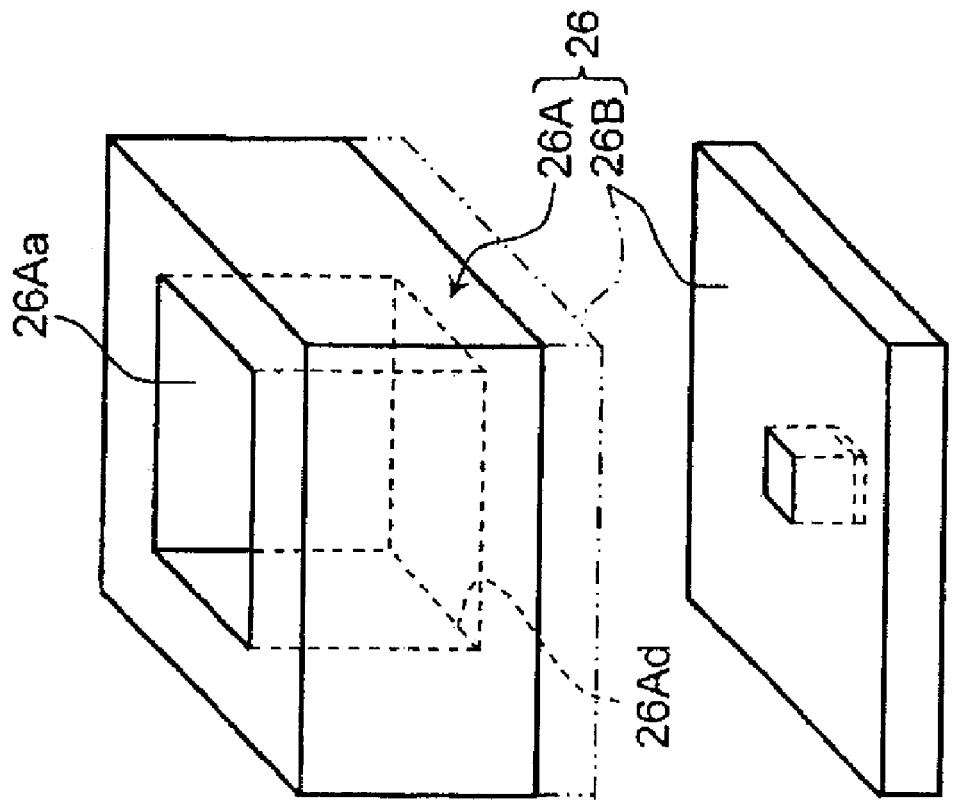
FIG. 6

FIG. 7 (a)
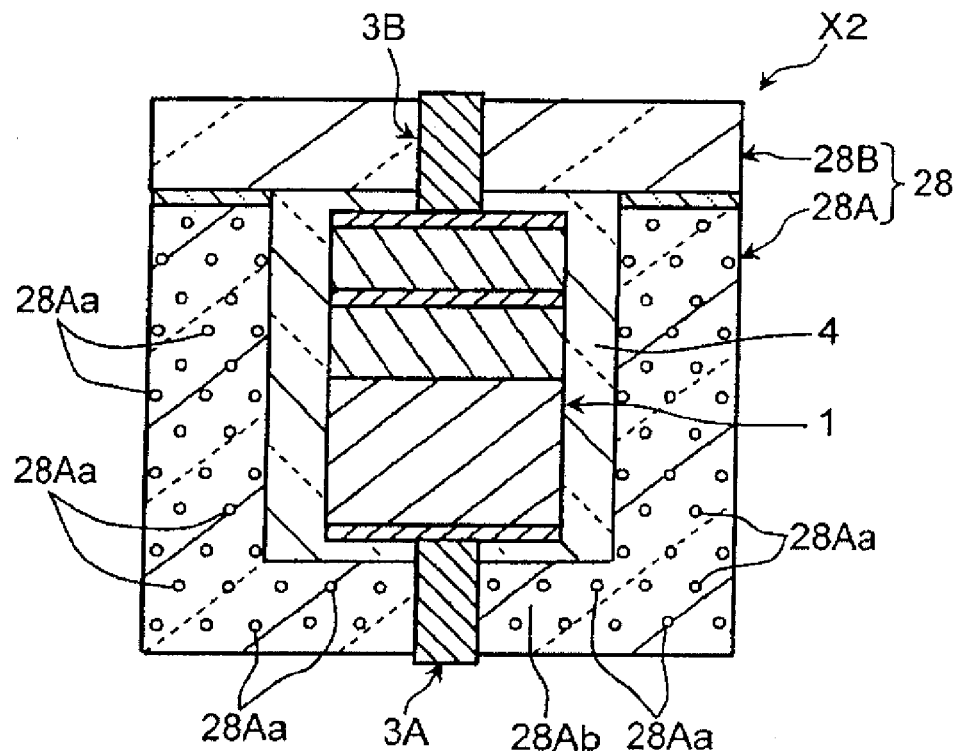
(b)
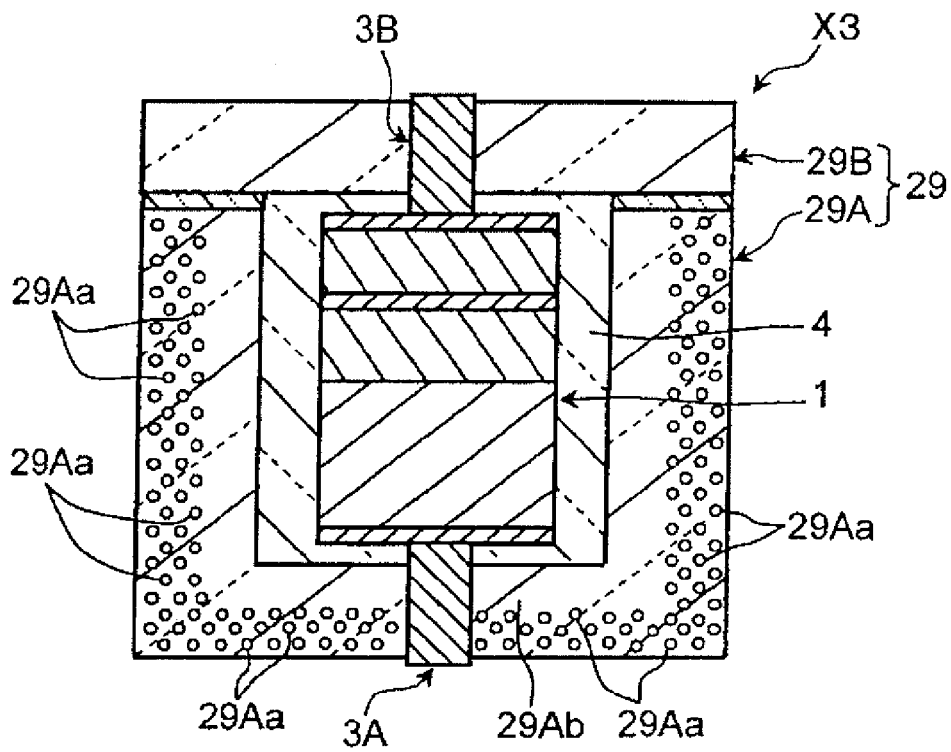

FIG. 18 (a)
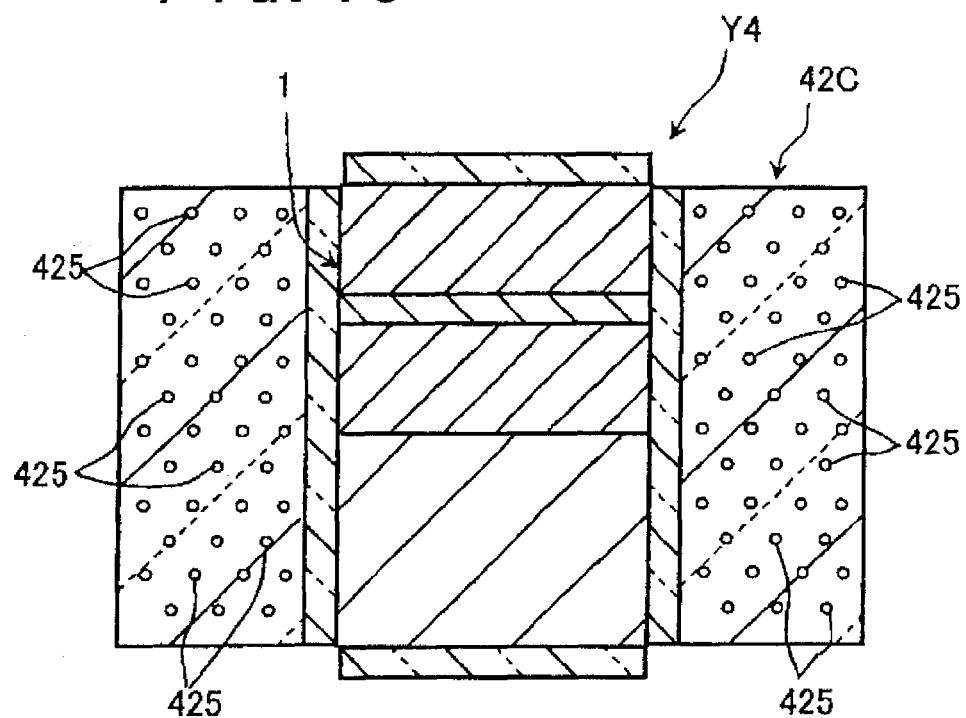
(b)
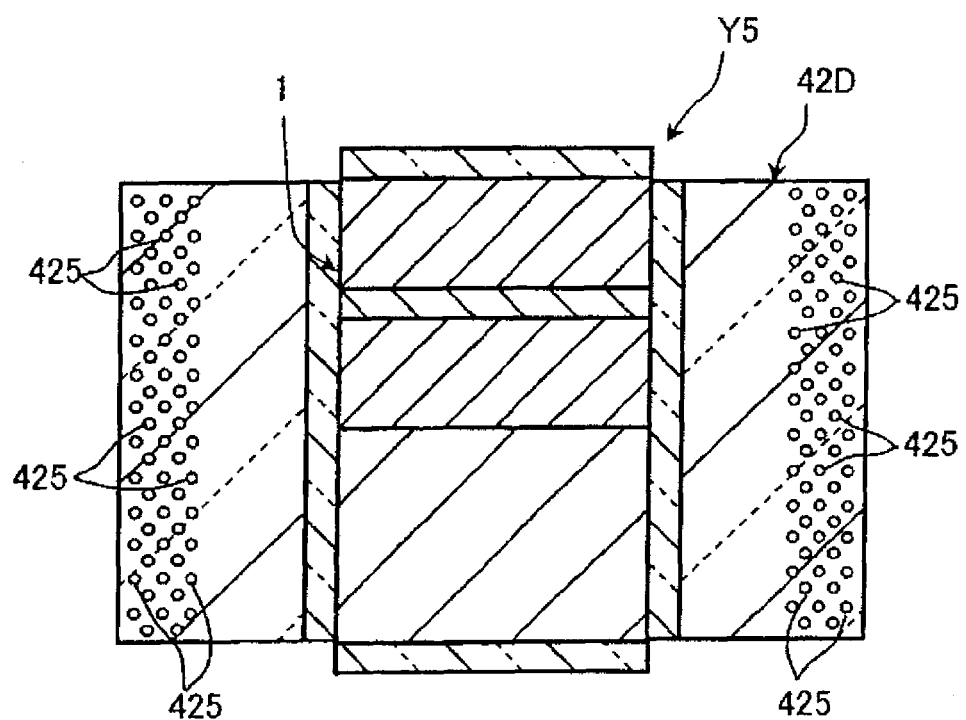

LIGHT EMITTING DEVICE AND LIGHT EMITTING MODULE

CROSS-REFERENCE TO THE RELATED APPLICATIONS

This application is a national stage of international application No. PCT/JP2007/051633 filed Jan. 31, 2007, and claiming benefit of priority under 35 USC 119 to Japanese Patent Application No. 2006-023120 filed Jan. 31, 2006, Japanese Patent Application No. 2006-098079 filed Mar. 31, 2006 and Japanese Patent Application No. 2006-098080 filed Mach 31, 2006, the entire contents of all applications are incorporated herein by reference.

TECHNICAL FIELD

The present invention relates to a light emitting device having a light emitting chip and a light emitting module such as an illuminating apparatus or display apparatus having the light emitting device.

BACKGROUND ART

As shown in FIG. 28, there has been provided a light emitting device 9 in which a light emitting chip 93 is disposed in a space 92 formed by an insulating substrate 90 and a frame 91 (for example, refer to Patent Document 1).

The insulating substrate 90 has a recess 94 for mounting the light emitting chip 93 and has conductor layers 95 and 96 formed on a surface thereof. The conductor layer 95 is conduction-connected to a bottom surface electrode (not shown) of the light emitting chip 93 and is provided continuously from a bottom surface 94A of the recess 94 to a bottom surface 90A of the insulating substrate 90. The conductor layer 96 is conduction-connected to an upper surface electrode (not shown) of the light emitting chip 93 through a wire 97 and is provided continuously from an upper surface 90B of the insulating substrate 90 to the bottom surface 90A.

The frame 91 has a penetration space 98 and is bonded to the upper surface 90B of the insulating substrate 90. In a state where the frame 91 is bonded to the insulating substrate 90, the space 92 for mounting the light emitting chip 93 is formed by the recess 94 of the insulating substrate 90 and the penetration space 98 of the frame 91. A transparent part 99 is disposed in the space 92 in order to protect the light emitting chip 93. The transparent part 99 is formed by filling the space 92 with a transparent resin.

As the light emitting chip 93, various kinds of elements are used. For example, in the case where white light is emitted in a light emitting device 9, a light emitting diode which emits blue light is used. In this case, a wavelength conversion layer for converting blue light into yellow light is disposed on a surface of the light emitting chip 93 or the transparent part 99, or a fluorescence material which emits yellow fluorescence is contained inside the transparent part 99.

On the other hand, in recent years, a light emitting chip which emits light (near-ultraviolet light to blue light) with a shorter wavelength has been developed (for example, refer to Patent Document 2). Such a light emitting chip with a shorter wavelength can also be used in the case where white light is emitted from the light emitting device 9.

Patent Document 1: Japanese Unexamined Patent Publication JP-A 5-175553 (1993)
Patent Document 2: Japanese Unexamined Patent Publication JP-A 2004-342732

DISCLOSURE OF INVENTION

Problem that the Invention is to Solve

However, in the light emitting device 9, a part of light emitted from the light emitting chip 93 is absorbed in the transparent part 99 in the case where the transparent part 99 is formed of a resin. In addition, intermolecular bonding of resin breaks due to energy of the absorbed light and material properties such as transmittance, bonding strength and hardness, of the transparent part 99 deteriorate with time. In addition, in the case where the transparent part 99 is formed by curing the transparent part 99 that is not hardened, such as sol-gel glass or low-melting-point glass formed of an inorganic material, a crack is generated in the transparent part 99 due to a stress resulting from volume contraction of the transparent part 99 occurring in curing the transparent part 99. As a result, in the case of using the light emitting device 9 for a long period of time, a problem, such as a reduction in the emission brightness of the light emitting device 9, may occur due to a drop in transmittance of the transparent part 99 or the crack generated in the transparent part 99. Particularly in the case where a light emitting diode that emits light in an ultraviolet region to a near-ultraviolet region or one that emits light with a short wavelength, such as a blue light emitting diode, is used as the light emitting chip 93 like the light emitting device 9 that emits white light, there is a high possibility that deterioration of properties, such as the transmittance, bonding strength and hardness, of the transparent part 99 will occur. In the case of using a light emitting chip that emits light with a shorter wavelength, which has been developed in recent years, the possibility that deterioration of the properties of the transparent part 99 will occur becomes higher.

In view of the above situation, it is an object of the invention to provide a light emitting device and module which can suppress deterioration of properties, such as transmittance, bonding strength and hardness, of a transparent part, which may be caused by light emitted from a light emitting chip, even in the case of using a light emitting chip emitted light of which has a short wavelength including an ultraviolet region to a near-ultraviolet region and a blue region and in which deterioration of emission brightness and the like does not easily occur even if used for a long period of time.

Means for Solving the Problem

A light emitting device of the invention includes a container which is formed of a transparent inorganic material and has a recessed opening; a light emitting chip which is disposed in the recessed opening of the container with a glass bonding member interposed therebetween and in which a first conduction type layer, a light emitting layer, and a second conduction layer are formed on a substrate; and a lid which is formed of a transparent inorganic material and seals the recessed opening of the container.

Furthermore, a light emitting device of the invention includes a light emitting chip in which a first conduction type layer, a light emitting layer, and a second conduction type layer are formed on a substrate; and one or a plurality of optical components which are bonded to a surface side of at least one of the second conduction type layer and the substrate in a contacted state with a glass bonding member interposed therebetween and is formed to have a transparency by an inorganic material.

Furthermore, a light emitting device of the invention includes a light emitting chip in which a first conduction type layer, a light emitting layer, and a second conduction type layer are formed on a substrate; and an optical component which is formed of glass and covers at least a part of a portion of the light emitting chip, from which light is emitted, in a contacted state.

EFFECTS OF THE INVENTION

Since the light emitting device according to the invention comprises the container which is formed of a transparent inorganic material and has the recessed opening, the light emitting chip which is disposed in the recessed opening of the container with the glass bonding member interposed therebetween and in which the first conduction type layer, the light emitting layer, and the second conduction layer are formed on the substrate, and the lid which is formed of a transparent inorganic material and blocks the recessed opening of the container, the light emitting chip is protected by the lid and the container formed of a transparent inorganic material. That is, the molecular structures of the container and lid formed of a transparent inorganic material are difficult to break due to light energy from a light emitting chip and a possibility that elements (the container and the lid), which protect the light emitting chip, will deteriorate due to the light energy of the light emitted from the light emitting chip is reduced compared with a known light emitting device in which a periphery of a light emitting chip is protected by a resin. Accordingly, a reduction in the emission brightness of a light emitting device is suppressed. Thus, the light emitting device according to the invention can output light stabilized over a long period of time.

Furthermore, in the light emitting device according to the invention, at least one of the substrate and the second conduction type layer in the light emitting chip is covered by the optical component formed of an inorganic material having a transparency. Therefore, at least one of the substrate and the second conduction type layer in the light emitting chip is protected by the optical component. Moreover, glass is generally a material whose transmittance or mechanical strength does not easily deteriorate compared with a resin. Accordingly, even if light from the light emitting chip is absorbed in the optical component when the light from the light emitting chip is transmitted through the optical component, a possibility that the transmittance and mechanical strength of the optical component will deteriorate due to radiant energy that the light has is very low. As a result, a possibility that an element (optical component) which protects the light emitting chip will deteriorate due to the light from the light emitting chip is reduced compared with the known light emitting device (refer to FIG. 28) in which a light emitting chip is protected by a resin. Accordingly, a reduction in radiant energy, radiant flux, and radiant intensity of emitted light is suppressed. Thus, the light emitting device according to the invention can output light stabilized over a long period of time.

Furthermore, in the light emitting device according to the invention, at least a part of the portion of the light emitting chip from which light is emitted is covered by the optical component formed of glass. Accordingly, the light emitting chip is protected by the optical component. In addition, the optical component is formed of glass that is a material whose transmittance with respect to light having a wavelength of 230 nm to 400 nm is high, whose molecular structure is difficult to break by optical absorption, and whose transmittance or mechanical strength does not deteriorate easily. Furthermore, since a light emitting chip is not covered with glass which changes from a liquid form, such as sol-gel glass or low-melting-point glass, to solid but solid glass is disposed in the periphery of the light emitting chip with a glass bonding member interposed therebetween, light from the light emitting chip enters the optical component more efficiently and the light energy is immediately diffused from the optical component to the outside with low loss while repeating reflection on the interface between the optical component and external gas. Accordingly, a possibility that the optical output of the light emitting device will deteriorate due to the light energy is very low compared with the known light emitting device (refer to FIG. 28) in which the periphery of the light emitting chip is protected by a resin. As a result, since a possibility that an element (optical component) which protects the light emitting chip will deteriorate due to the light energy of the light emitted from the light emitting chip is reduced, a drop in the emission brightness of the light emitting device can be reduced. Thus, the light emitting device according to the invention can output light stabilized over a long period of time.

BRIEF DESCRIPTION OF DRAWINGS

FIG. 6 is a longitudinal sectional view illustrating other examples of an optical component in a light emitting device.

FIG. 7 is a longitudinal perspective view illustrating other examples of a light emitting device.

FIG. 18 is a longitudinal perspective view illustrating other examples of a light emitting device.

BEST MODE FOR CARRYING OUT THE INVENTION

Figure 1:
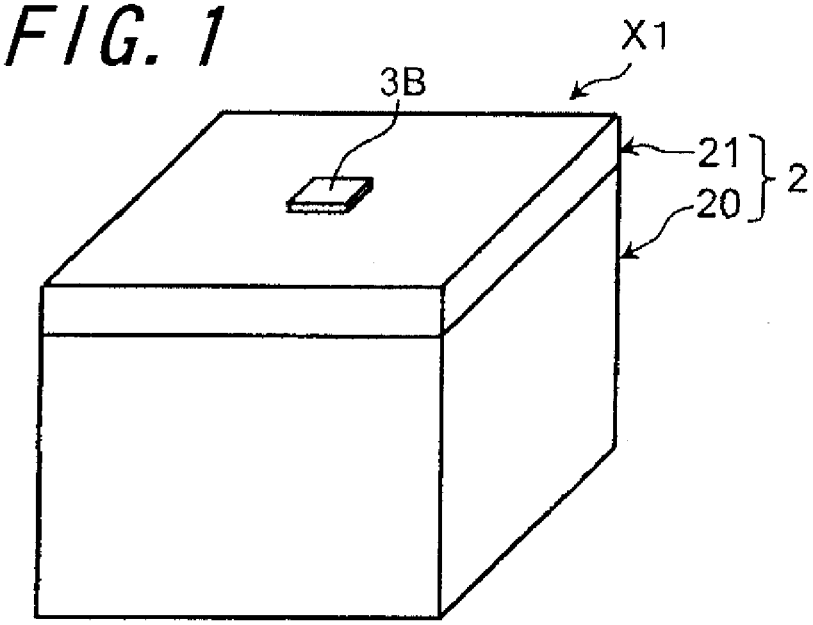
FIG. 1 is an entire perspective view illustrating a light emitting device according to a first embodiment of the invention.

Now referring to the drawings, embodiments of a light emitting device of the invention will be described in detail.

First Embodiment

A light emitting device according to a first embodiment of the invention will be described with reference to FIGS. 1 to 3.

Figure 2:
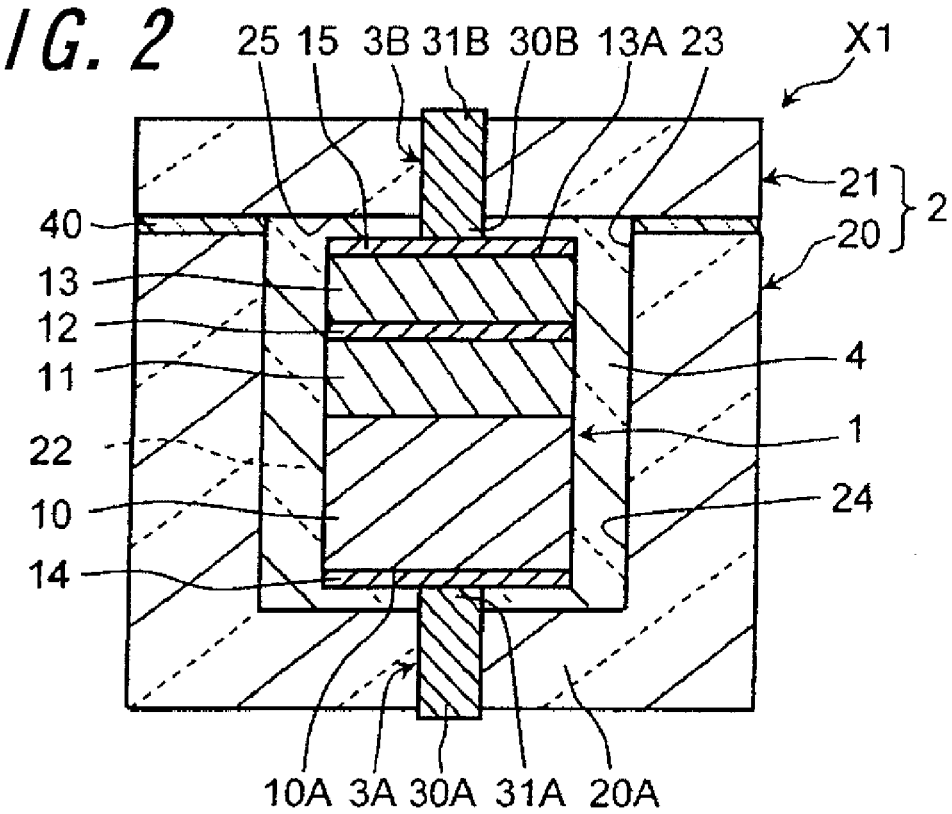
FIG. 2 is a longitudinal sectional view illustrating the light emitting device shown in FIG. 1.
Figure 3:
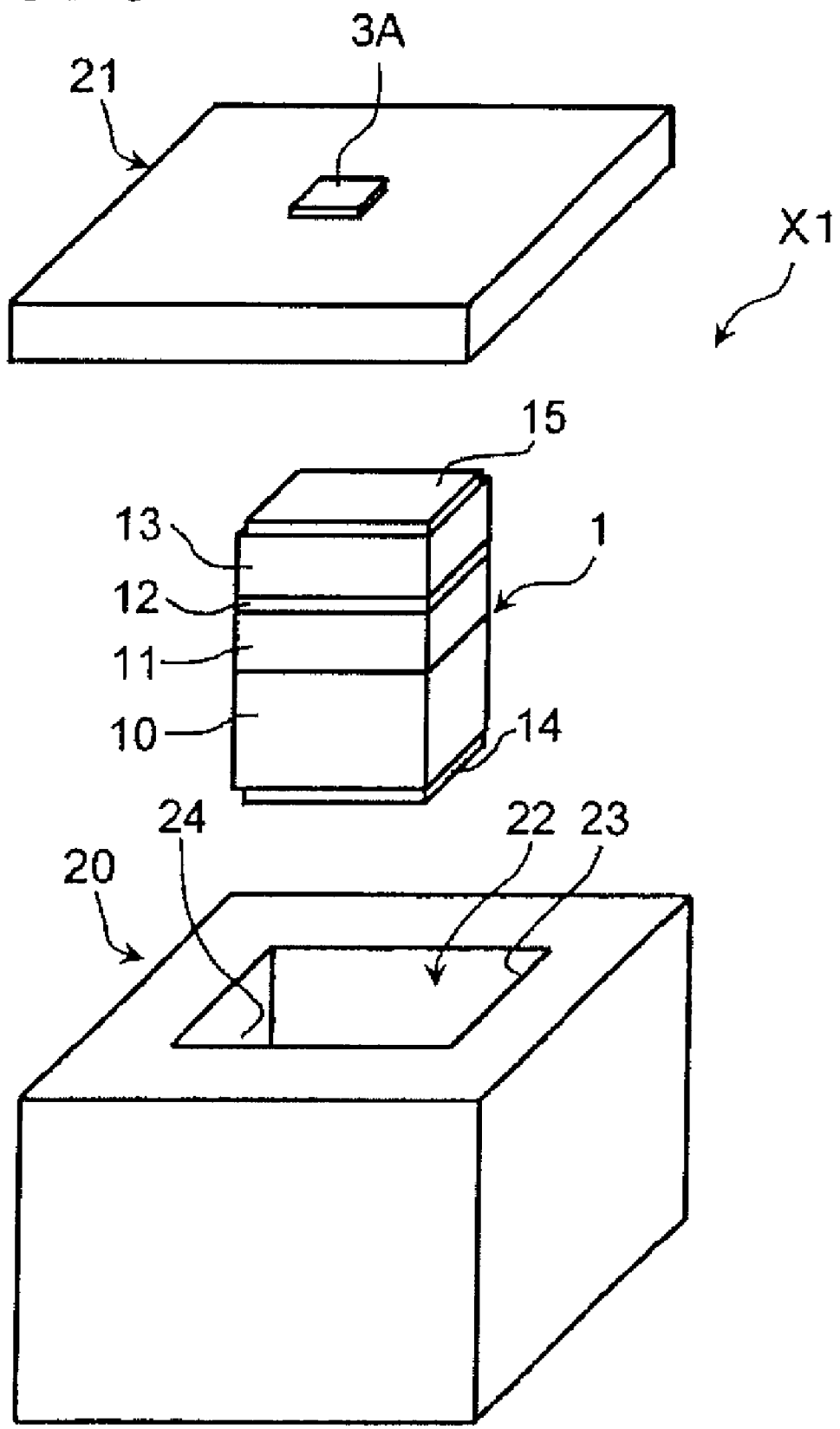
FIG. 3 is an exploded perspective view illustrating the light emitting device shown in FIG. 1.

A light emitting device X1 shown in FIGS. 1 to 3 includes a light emitting chip 1, an optical component 2 formed of a container 20 and a lid 21, and external connection terminals 3A and 3B, and the light emitting chip 1 is disposed in a space formed by the optical component 2. That is, in the light emitting device X1, the entire light emitting chip 1 is covered by the optical component 2.

The light emitting chip 1 is formed by stacking an n-type semiconductor layer 11, a light emitting layer 12, and a p-type semiconductor layer 13 on a substrate 10 and is configured to emit light at least laterally. The light emitting chip 1 is, for example, a ZnO-based oxide semiconductor light emitting diode and is configured to emit light with a wavelength of 230 nm to 450 nm. It is needless to say that things other than the ZnO-based oxide semiconductor light emitting diode can also be used as the light emitting chip 1. For example, compound semiconductors, such as a silicon carbide (SiC)-based compound semiconductor, a diamond-based compound semiconductor, and a boron nitride-based compound semiconductor, may be used. It is preferable to properly select the type of the light emitting chip 1 to be used according to the wavelength of light emitted in the light emitting device X1.

First and second chip electrodes 14 and 15 are formed on a bottom surface 10A of the substrate 10 and an upper surface 13A of the p-type semiconductor layer 13, respectively. The first and second chip electrodes 14 and 15 serve to apply a voltage among the n-type semiconductor layer 11, the light emitting layer 12, and the p-type semiconductor layer 13 in order to make light emitted from the light emitting layer 12. The first and second chip electrodes 14 and 15 are transparently formed in the case where light needs to be transmitted and are formed of a material with high reflectance in the case where light needs to be reflected. As materials for forming the first and second chip electrodes 14 and 15, ITO (Indium Tin Oxide) glass or a zinc oxide-based transparent conductive film, $SnO_2$ and $In_2O_3$ which are oxides of indium (In) and tin (Sn), and the like are used in the case where the first and second chip electrodes 14 and 15 are formed transparently. In addition, in the case where the first and second chip electrodes 14 and 15 are formed of a material with high reflectance, a metal and an alloy having high reflectance with respect to light having a wavelength of 230 nm to 450 nm, such as aluminum, rhodium, and silver, are used.

The optical component 2 has a function of protecting the light emitting chip 1. In addition, the optical component 2 has a function of guiding light emitted from the light emitting chip 1 to the outside. The optical component 2 includes the container 20 and the lid 21.

The entire container 20 has a transparency by an inorganic material and the container 20 is formed in a shape of a box with bottom, which has a recess 22 and an upper opening 23. As a transparent inorganic material for forming the container 20, for example, quartz glass, optical glass containing boric acid and silicic acid, crystal, sapphire, or fluorite may be used.

The recess 22 is a space in which the light emitting chip 1 is disposed and has a larger volume than the light emitting chip 1. In the recess 22, the light emitting chip 1 is disposed in a state where a glass bonding member 4 is interposed between an inner surface 24 of the recess 22 and a side surface of the light emitting chip 1.

The glass bonding member 4 has a transparency and is formed of a material with a smaller refractive index than the optical component 2. As the glass bonding member 4, a bonding member formed of a transparent inorganic material, such as sol-gel glass, water glass, and low-melting-point glass, which has high transmittance with respect to light having a wavelength of 230 nm to 450 nm and is mineralized using fusion or hydrolysis reaction may be used.

The lid 21 serves to seal the upper opening 23 of the container 20 and is formed in a shape of a transparent plate by an inorganic material, such as quartz glass, optical glass containing boric acid and silicic acid, crystal, sapphire, or fluorite. As a transparent inorganic material for forming the lid 21, the same material as a transparent inorganic material, such as quartz glass, optical glass containing boric acid and silicic acid, crystal, sapphire, or fluorite, used to form the container 20 may be used. Thus, since a thermal expansion difference between the container 20 and the lid 21 is eliminated, a stress resulting from the thermal expansion difference occurring in a manufacturing process or operation environment of the light emitting device X1 is suppressed. As a result, damage, such as crack, occurring in the container 20, the lid 21, or the glass bonding member 4 can be suppressed.

The lid 21 is fixed to the container 20 through a bonding member 40 formed of an inorganic material, such as sol-gel glass, low-melting-point glass, water glass, and solder. In the case where the lid 21 blocks the upper opening 23 of the container 20, the glass bonding member 4 formed of a transparent inorganic material, such as sol-gel glass, low-melting-point glass, and water glass, is interposed between an inner surface 25 of the lid 21 and the upper surface of the light emitting chip 1.

In addition, the bonding member 40 may be omitted in the case where a sufficient bonding strength is maintained between the light emitting chip 1 and the lid 21 by the glass bonding member 4.

The external connection conductors 3A and 3B are portions conduction-connected to wiring lines or terminals of a predetermined mounting board when the light emitting device X1 is mounted on the mounting board. The external connection conductor 3A passes through a low wall container 20A of the container 20, and both end parts 30A and 31A thereof protrude from the low wall container 20A of the container 20. That is, the end part 30A is conduction connected to the first electrode 14 of the light emitting chip 1, and the end part 30B is exposed in a state protruding from the container 20. On the other hand, the external connection conductor 3B passes through the lid 21, and both end parts 30B and 31B thereof protrude the from the lid 21. That is, the end part 30B is conduction connected to the second electrode 15 of the light emitting chip 1, and the end 31B is exposed in a state protruding from the lid 21. In addition, since the external connection conductors 3A and 3B are disposed in the direction perpendicular to light emitted laterally from the light emitting chip 1, light absorption by the external connection conductors 3A and 3B is reduced. As a result, optical output of the light emitting device X1 is improved.

In the light emitting device X, the entire light emitting chip 1 is surrounded by the optical component 2 (20, 21) formed of quartz glass, optical glass containing boric acid and silicic acid, crystal, sapphire, or fluorite. Therefore, in the light emitting device X1, even if light emitted from the light emitting chip 1 is absorbed in a periphery (optical component 2 (20, 21)) of the light emitting chip 1, the molecular structure is difficult to break due to the light energy, compared with the optical component 2 (20, 21) formed of a resin. Accordingly, a possibility that the transmittance or the mechanical strength of the optical component 2 (20, 21) will deteriorate due to the light energy from the light emitting chip 1 is very low, compared with a known light emitting device 9 (refer to FIG. 10) in which the periphery of the light emitting chip 1 is protected by a resin. Moreover, a stress occurring by volume contraction in a manufacturing process of the light emitting device X1 is limited to the glass bonding member 4 by disposing the light emitting chip 1 inside the container 20 where the recess 22 is formed and filling a gap portion between the light emitting chip 1 and the inner surfaces 23 and 25 with the glass bonding member 4 and sealing the gap portion with the lid 21. That is, the optical component 2 (20, 21) having the solid shape is prepared beforehand as a transparent inorganic material which covers the entire light emitting chip 1, and the gap between the light emitting chip 1 and the inner surfaces 23 and 25 are made to be as thin as possible and the glass bonding member 4 is filled into the gap to be then cured when the light emitting chip 1 is disposed inside the container 20. Accordingly, since a member whose volume contracts in the manufacturing process of the light emitting device X1 is limited to the glass bonding member 4 and the volume of the glass bonding member 4 filled in the gap is made to be as small as possible, a crack generated in the glass bonding member 4 can be suppressed. As a result, a possibility that the transmittance or the mechanical strength of an element (optical component 2 (20, 21)) which protects the light emitting chip 1 will deteriorate due to the light from the light emitting chip 1 is reduced, a reduction in emission brightness of the light emitting device X1 is suppressed, and a crack generated in the optical component 2 (20, 21) or the glass bonding member 4 generated in the manufacturing process of a light emitting device is suppressed. Thus, the light emitting device X1 can output light stabilized over a long period of time.

In addition, the glass bonding member 4 preferably has a thickness of 0.05 to 1 mm. In the case where the thickness of the glass bonding member 4 is smaller than 0.05 mm, mechanical properties, such as a bonding strength or hardness, of the glass bonding member 4 fall remarkably. Accordingly, since the optical component 2 (20, 21) easily deviates from the light emitting chip 1 by a physical impact on the light emitting device X1 and the crack is easily generated in the glass bonding member 4, the optical output of the light emitting device X1 is reduced.

In addition, in the case where the thickness of the glass bonding member 4 is larger than 1 mm, a crack is easily generated due to volume contraction occurring in curing the glass bonding member 4 that is not hardened and a stress occurring according to the volume contraction. As a result, optical output and long-time reliability of the light emitting device X1 are lowered. Accordingly, it is preferable that the thickness of the glass bonding member 4 be 0.05 to 1 mm, such that the light emitting device X1 can normally operate over a long period of time.

In addition, a possibility that gas will remain between the light emitting chip 1 and the optical component 2 (20, 21) is reduced by adopting the configuration in which the light emitting chip 1 and the optical component 2 (20, 21) come in contact with each other and are bonded to each other through the glass bonding member 4. Therefore, a possibility that light from the light emitting chip 1 will be reflected between the light emitting chip 1 and the optical component 2 is reduced compared with a case where gas remains between the light emitting chip 1 and the optical component 2. Thus, in the light emitting device X1, light from the light emitting chip 1 can be efficiently emitted to the optical component 2 (20, 21). Particularly in the case where the refractive index of the glass bonding member 4 is set smaller than that of the optical component 2 (20, 21), light from the light emitting chip 1 on the interface between the glass bonding member 4 and the optical component 2 (20, 21) enters the optical component 2 (20, 21) without reflection according to the Snell's law. In a part of light reflected on the interface between the optical component 2 (20, 21) and external gas, a part thereof is totally reflected and is laterally emitted on the interface between the glass bonding member 4 and the optical component 2 (20, 21) according to the Snell's law. Accordingly, light absorption by the light emitting chip 1 is suppressed and the amount of light emitted to the outside of the light emitting device X1 is increased. As a result, by adopting the configuration in which the optical component 2 (20, 21) is made to come in contact with the light emitting chip 1 through the glass bonding member 4, it is possible to make the light from the light emitting chip 1 introduced to the optical component 2 (20, 21) more efficiently and to improve the optical output of the light emitting device X1.

Second Embodiment

Next, a light emitting module according to a second embodiment of the invention will be described with reference to FIGS. 4 and 5.

Figure 4:
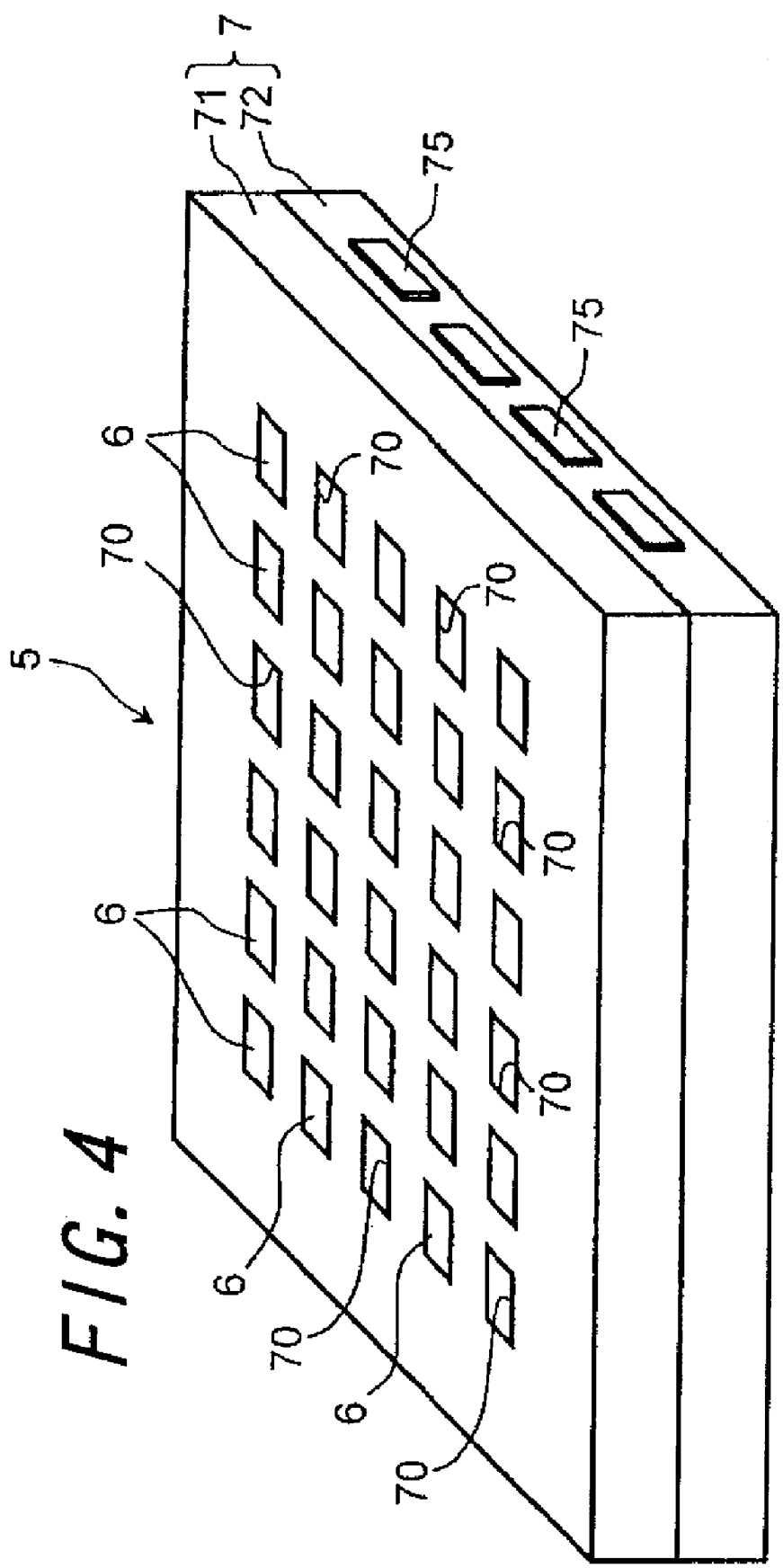
FIG. 4 is an entire perspective view illustrating a light emitting module according to a second embodiment of the invention.
Figure 5:
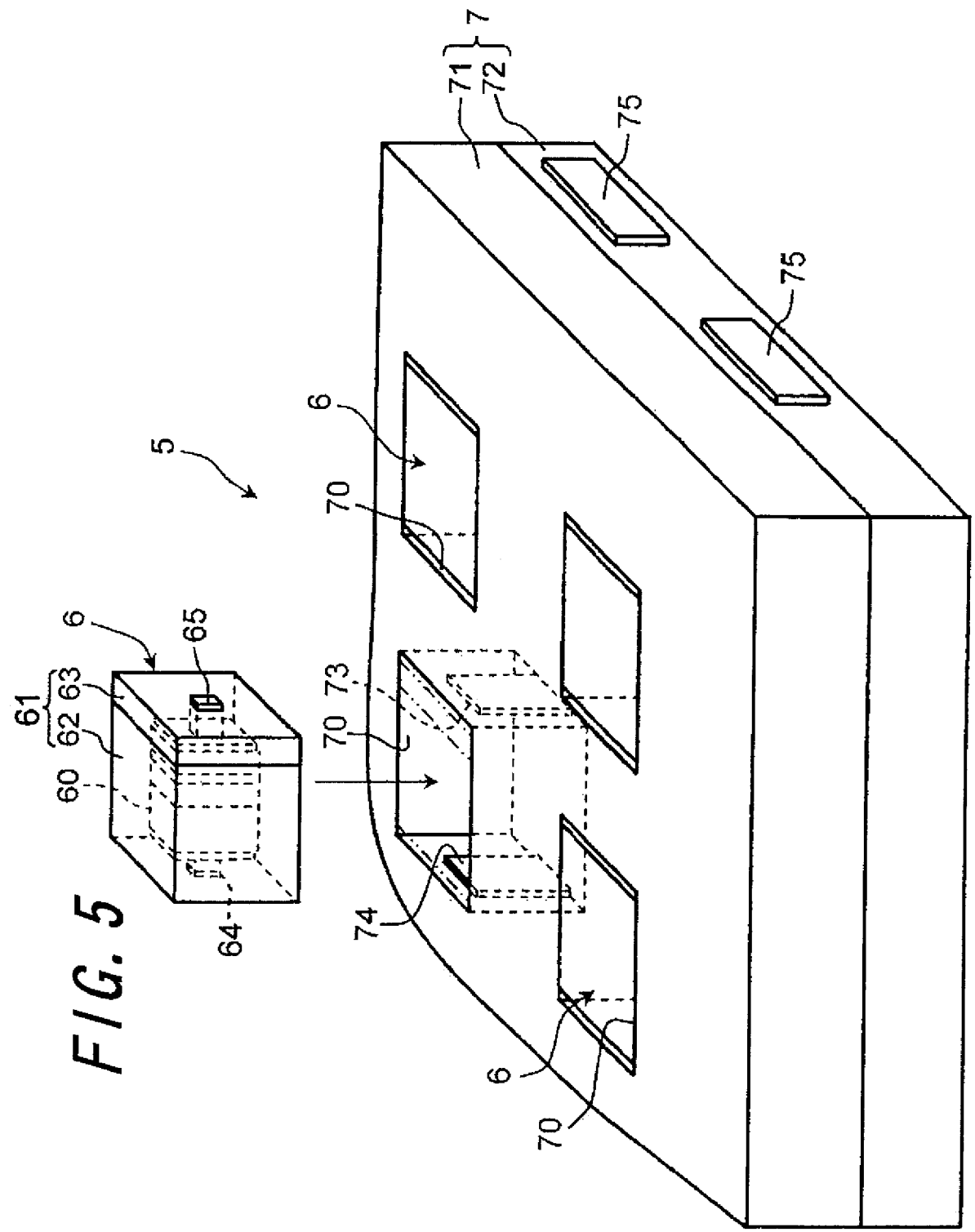
FIG. 5 is an exploded perspective view illustrating a part of main components of the light emitting module shown in FIG. 4.

A light emitting module 5 shown in FIGS. 4 and 5 may be used as an illuminating apparatus or a display apparatus and includes a plurality of light emitting devices 6 and an insulating substrate 7.

Similar to the light emitting device X1 (refer to FIGS. 1 to 3) described earlier, a periphery of a light emitting chip 60 is surrounded by an optical component 61 in each of the plurality of light emitting devices 6, and the entire light emitting device 6 is formed in the rectangular parallelepiped shape. The optical component 61 has a container 62 and a lid 63. External connection terminals 64 and 65 are provided so as to pass through the container 62 and the lid 63, respectively.

The insulating substrate 7 serves to fix the plurality of light emitting devices 6 by positioning and supply driving power to each light emitting device 6. The insulating substrate 7 has a first substrate 71 in which a plurality of through holes 70 are formed and a second substrate 72 in which wiring lines (not shown) are patterned and formed.

The plurality of through holes 70 of the first substrate 71 are used for placing the light emitting devices 6 therein and are disposed in a matrix. A pair of terminals 73 and 74 for contact with electrodes 62 and 63 of the light emitting device 6 are provided on an inner surface of each through hole 70 so as to be opposite to each other. That is, in a state where the light emitting device 6 is disposed in each through hole 70, the plurality of light emitting devices 6 are disposed in a matrix and the electrodes 62 and 63 of each light emitting device 6 and the pair of terminals 73 and 74 of the through hole 70 are in a state where conduction connection therebetween is made.

Wiring lines (not shown) of the second substrate 72 is conduction connected to the pair of terminals 73 and 74 of the first substrate 71. In addition, the wiring lines are conduction-connected to terminals 75 provided on a side surface of the second substrate 72. The pattern of wiring lines is designed according to a driving mode of the plurality of light emitting devices 6 in the light emitting module 5, for example.

For example, in the case where the light emitting module 5 is configured as a display apparatus, each light emitting device 6 can be driven individually. Accordingly, the wiring lines are patterned and formed such that each light emitting device 6 can be driven individually. On the other hand, in the case where the light emitting module 5 is configured as an illuminating apparatus, each light emitting device 6 does not necessarily need to be configured to be driven individually but, for example, all parts may be simultaneously driven or the plurality of light emitting devices 5 may be divided into a plurality of groups so as to be able to be driven for every group. Accordingly, the wiring lines are patterned and formed such that such driving is possible.

In the light emitting module 5, the same one as the light emitting device X1 (refer to FIGS. 1 to 3) described earlier is used as the light emitting device 6. That is, since deterioration of an optical component 61 (62, 63) by light from the light emitting chip 60 is reduced in the light emitting device 6, the light emitting module 5 which uses such a light emitting device 6 can output the light stabilized over a long period of time.

In addition, in the light emitting module 5, although the plurality of through holes 70 are provided in the first substrate 71 and the light emitting devices 6 are disposed in the through holes 70. However, the light emitting devices 6 may be simply mounted on a surface of the insulating substrate.

FIG. 6($a$) and FIG. 6($b$) illustrate other examples of containers 26 and 27 in an optical component. The containers 26 and 27 include tubular components 26A and 27A having penetration spaces 26Aa and 27Aa and plate-shaped members 26B and 27B, respectively. Similar to the container 20 of the light emitting device X1 described earlier, the entire containers 26 and 27 are formed in shapes of a box with bottom.

The tubular components 26A and 27A have the penetration spaces 26Aa and 27Aa for placing light emitting chips therein, respectively. The tubular component 26A (refer to FIG. 6($a$)) of the container 26 is integrally formed and the tubular component 27A (refer to FIG. 6($b$)) of the container 27 is formed by four flat plate 27Ab and 27Ac. On the other hand, the plate-shaped members 26B and 273 serve to block lower openings 26Ad and 27Ad of the tubular components 26A and 27A.

Light emitting devices X2 and X3 shown in FIG. 7($a$) and FIG. 7($b$) have the configurations in which fluorescence materials 28Aa and 29Aa are dispersed in containers 28A and 29A of optical components 28 and 29, respectively. In the light emitting device X2 shown in FIG. 7($a$), the fluorescence materials 28Aa are dispersed in the entire container 28A in the optical component 28. In the light emitting device X3 shown in FIG. 7($b$), the fluorescence materials 29Aa are selectively dispersed on an outer surface part of the container 29A in the optical component 29.

In addition, also in the case where fluorescence materials are dispersed in the glass bonding member 4 without fluorescence materials dispersed in the optical component, the same effect is obtained (not shown).

The fluorescence materials 28Aa and 29Aa contained in the containers 28A and 29A of the optical components 28 and 29 are selected according to the wavelength (color) of light to be emitted from the light emitting devices X2 and X3. For example, in the case where white light is emitted from the light emitting devices X2 and X3, a first fluorescence material that converts light emitted from the light emitting chip 1 into light having a peak of emission intensity in a wavelength range of 400 to 500 nm, a second fluorescence material that converts the light emitted from the light emitting chip 1 into light having a peak of emission intensity in a wavelength range of 500 to 600 nm, and a third fluorescence material that converts the light emitted from the light emitting chip 1 into light having a peak of emission intensity in a wavelength range of 600 to 700 nm are used as the fluorescence materials 28Aa and 29Aa. As the first fluorescence material, for example, $(Sr, Ca, Ba, Mg)_{10}(PO_4)_6Cl_2$: Eu or $BaMgAl_{10}O_{17}$: Eu may be mentioned. As the second fluorescence material, for example, $SrAl_2O_4$:Eu, ZnS:Cu, Al or $SrGa_2S_4$:Eu may be mentioned. As the third fluorescence material, for example, SrCaS:Eu, $La_2O_2S$:Eu, or $LiEuW_2O_8$ may be mentioned.

On the other hand, in the cases when the white light is emitted from the light emitting devices X2 and X3 by using the first to third fluorescence materials, for example, one that emits light having at least one peak of emission intensity in a wavelength range of 230 to 450 nm is used as the light emitting chip 1. As the light emitting chip 1, compound semiconductor light emitting diodes, such as a ZnO-based oxide semiconductor, a silicon carbide (SiC)-based compound semiconductor, a diamond-based compound semiconductor, and a boron nitride-based compound semiconductor, are mentioned.

In addition, it may also be possible to make the light emitting device X2 and X3 emit white light by using one that emits blue light as the light emitting chip 1 and using, as the fluorescence materials 28Aa and 29Aa, ones that convert blue light into yellow light, for example, an yttrium aluminum garnet-based fluorescence material (YAG) activated by cerium (Ce) or an alkaline earth metal orthosilicate fluorescence material activated by bivalent europium (Eu).

In the light emitting device X2 shown in FIG. 7($a$), the optical component 28 (container 28A) in which the fluorescence materials 28Aa are dispersed can be easily formed since the fluorescence materials 28Aa are dispersed in the entire container 28A in the optical component 28. That is, the light emitting device X2 is advantageous in that the optical component 28 (28A) can be easily manufactured. On the other hand, in the light emitting device X3 shown in FIG. 7($b$), an optical path difference between light horizontally propagating through the container 29A of the optical component 29 and light propagating in a direction inclined from the horizontal direction is reduced since the fluorescence materials 29Aa are selectively dispersed on the outer surface part of the container 29A in the optical component 29. As a result, since a difference in wavelength conversion amount between the light transmitted in the horizontal direction and the light transmitted obliquely is reduced, a part of light from the light emitting chip 1 is transmitted and the wavelength of the part of light is converted. Accordingly, in the case where a mixed color thereof is emitted, color unevenness is suppressed, which allows light having a uniform color to be emitted from the entire device.

It is needless to say that the light emitting devices X2 and X3 may also be configured to emit light with a color other than the white color by appropriately selecting the types of the fluorescence materials 28Aa and 29Aa used. If necessary, the fluorescence materials 28Aa and 29Aa may be contained in the lids 28B and 29B of the optical components 28 and 29, or the fluorescence materials 28Aa and 29Aa for lower walls 28Ab and 29Ab in the containers 28A and 29A of the optical components 28 and 29 may be omitted. In addition, a wavelength conversion layer containing fluorescence materials may be provided on outer surfaces of the optical components 28 and 29 instead of dispersing the fluorescence materials 28Aa and 29Aa in the containers 28A and 29A of the optical components 28 and 29.

Third Embodiment

Next, a light emitting device according to a third embodiment of the invention will be described with reference to FIGS. 8 and 9.

Figure 8:
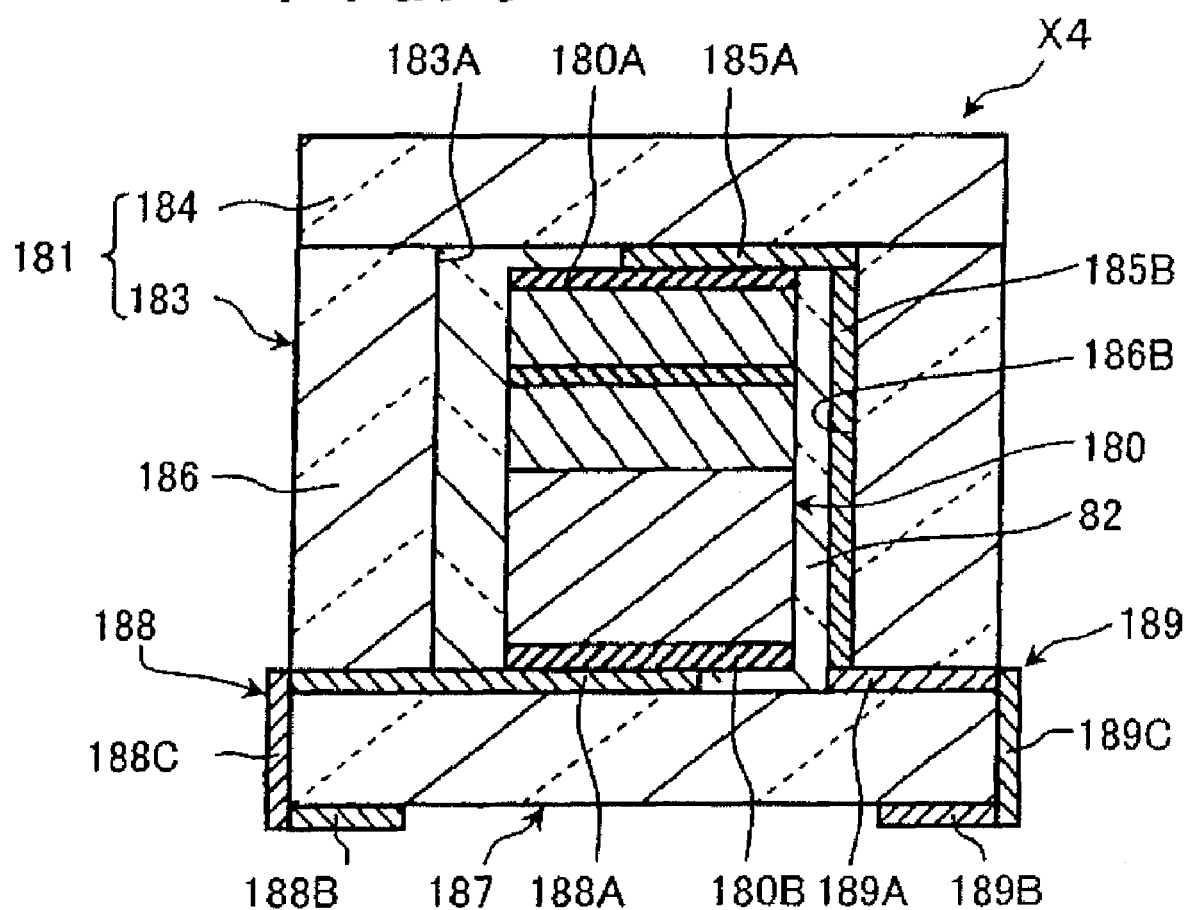
FIG. 8 is a longitudinal sectional view illustrating a light emitting device according to a third embodiment of the invention.

A light emitting device X4 shown in FIG. 8 is configured such that surface mounting is possible and includes a light emitting chip 180 and an optical component 181 formed in a hollow shape.

The light emitting chip 180 is the same as the light emitting chip 1 (refer to FIGS. 1 to 3) of the light emitting device X1 according to the first embodiment of the invention described earlier and has electrodes 180A and 180B. The light emitting chip 180 is disposed inside the optical component 181 in a state where a glass bonding member 182 is interposed between an outer surface of the light emitting chip 180 and an inner surface of the optical component 181. That is, in the light emitting device X4, the entire light emitting chip 180 is surrounded by the optical component 181.

The refractive index of the glass bonding member 182 is smaller than the refractive index of the optical component 181. In addition, the same material as in the light emitting device X1 (refer to FIGS. 1 to 3) described earlier may be used as a material for forming the glass bonding member 182.

The optical component 181 has a configuration in which an upper opening 183A of a container 183 is blocked with a lid 184 and is formed of a transparent inorganic material such that the entire optical component 181 has a transparency. The same material as in the light emitting device X1 (refer to FIGS. 1 to 3) described earlier may be used as an inorganic material for forming the optical component 181 (the container 183 and the lid 184).

Figure 9:
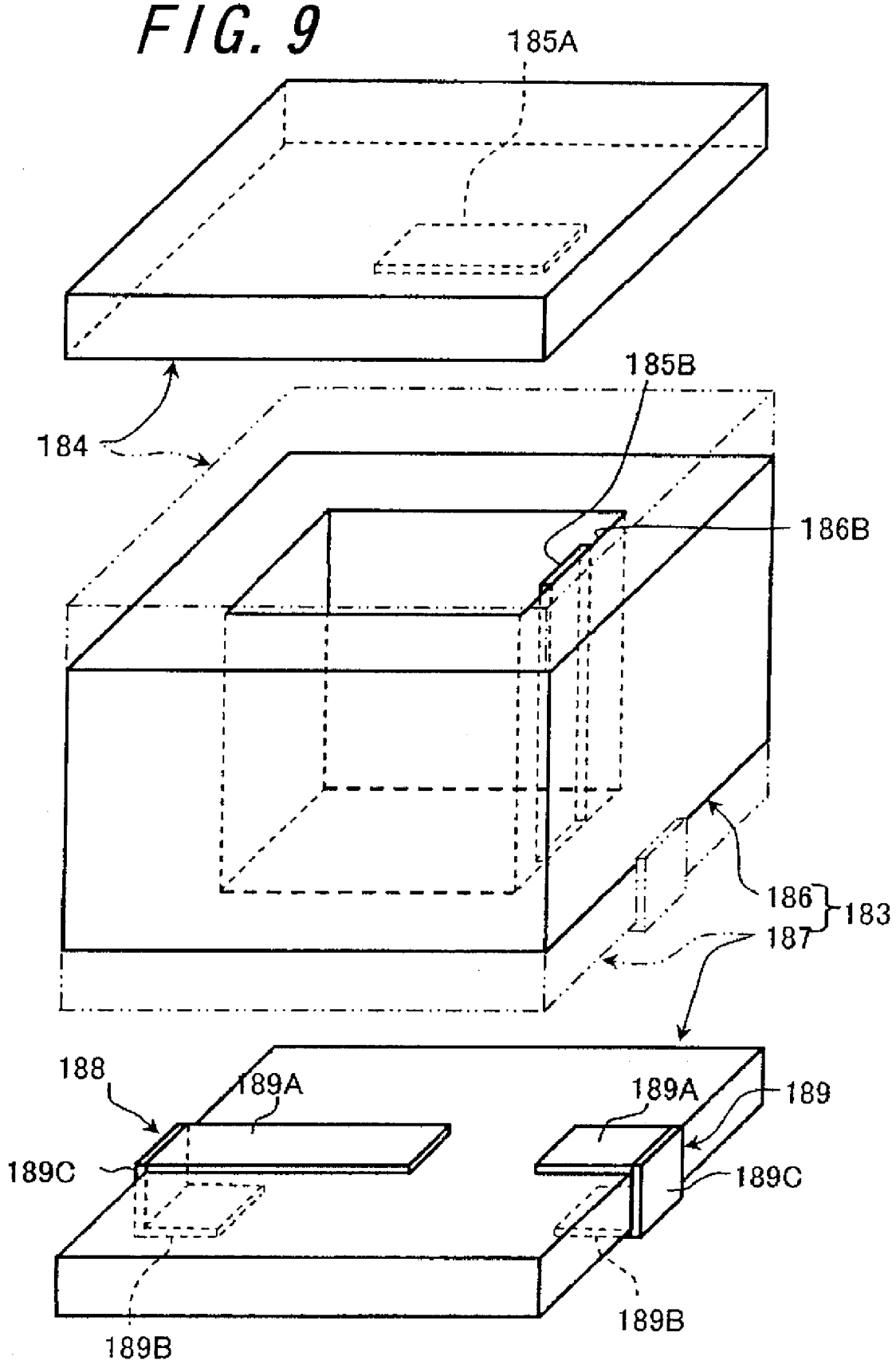
FIG. 9 is an exploded perspective view illustrating an optical component in the light emitting device shown in FIG. 8.

As shown in FIGS. 8 and 9, a lead 185A that is conduction-connected to the electrode 180A of the light emitting chip 180 is provided in the lid 184.

The container 183 is formed in a shape of a box with bottom by blocking a lower opening 186A of a tubular component 186 with a mount substrate 187. A lead 185B extending in an up and down direction is formed on an inner surface 1863 of the tubular component 186. The lead 185B is in contact with the lead 185A of the lid 184.

The mount substrate 187 serves to mount the light emitting chip 180 thereon and to block the lower opening 186A of the tubular component 186. External connection conductors 188 and 189 are formed in the mount substrate 187.

The external connection conductors 188 and 189 have upper surface conductor portions 188A and 189A that are conduction-connected to the electrodes 180A and 180B of the light emitting chip 180, bottom surface conductor portions 188B and 189B that are conduction-connected to wiring lines of a mount object, such as a circuit board, and side surface conductor portions 188C and 189C that make connections between the upper surface conductor portions 188A and 189A and the bottom surface conductor portions 188B and 189B, respectively.

The upper surface conductor portion 188A is conduction-connected to the electrode 180B of the light emitting chip 180 through a conductive bonding member, such as solder or a conductive resin. On the other hand, the upper surface conductor portion 189A is conduction-connected to the electrode 180A of the light emitting chip 180 through the leads 185A and 185B.

In the light emitting device X4, the light emitting chip 180 is surrounded by the optical component 181 formed of glass and the glass bonding member 182 is interposed between an inner surface of the optical component 181 and a surface of the light emitting chip 180. Therefore, similar to the light emitting device X1 (refer to FIGS. 1 and 2) described earlier, light emitted from the light emitting chip 180 can be efficiently guided to the optical component 181. In addition, since the refractive index of the optical component 181 is larger than that of the glass bonding member 182, reflection occurring on the interface between the glass bonding member 182 and the optical component 181 is reduced when light enters the optical component 181 from the glass bonding member 182. As a result, the light from the light emitting chip 180 can be more efficiently guided to the optical component 181. Moreover, in a part of light reflected on the interface between the optical component 181 and external gas, a part thereof is totally reflected and is laterally emitted on the interface between the glass bonding member 182 and the optical component 181 according to the Snell's law. Accordingly, light absorption by the light emitting chip 180 is reduced and the amount of light emitted to the outside of the light emitting device X4 is increased. As a result, the light from the light emitting chip 180 can be introduced more efficiently to the optical component 181 through the glass bonding member 182 and the optical output of the light emitting device X4 can be improved.

Fourth Embodiment

Next, a light emitting device according to a fourth embodiment of the invention will be described with reference to FIGS. 10 and 11.

Figure 10:
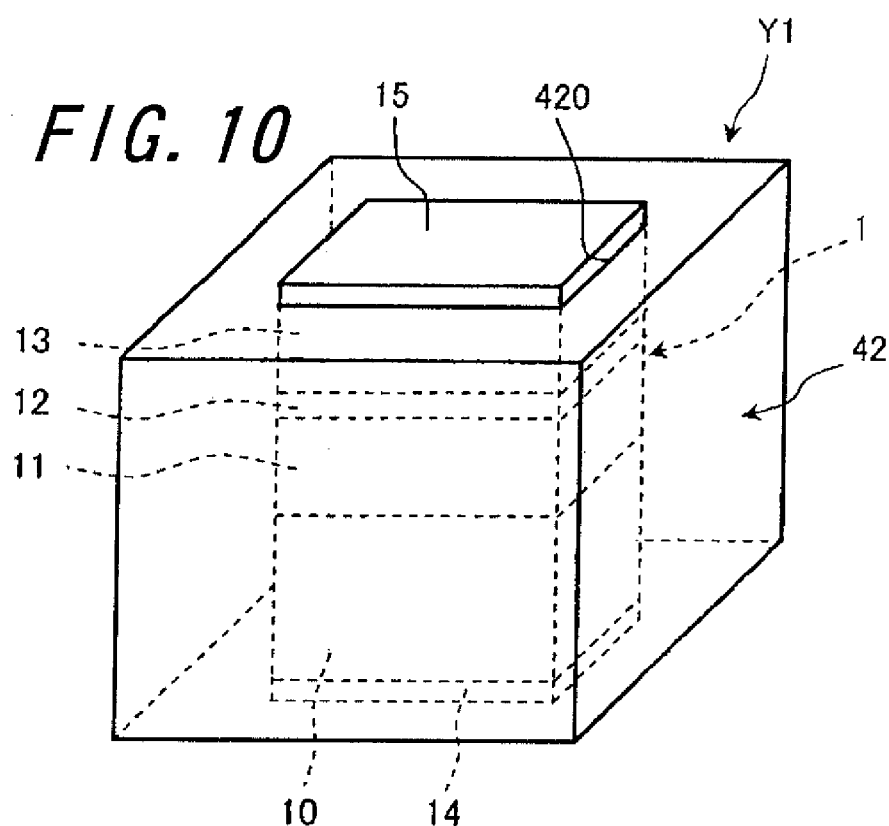
FIG. 10 is an entire perspective view illustrating a light emitting device according to a fourth embodiment of the invention.
Figure 11:
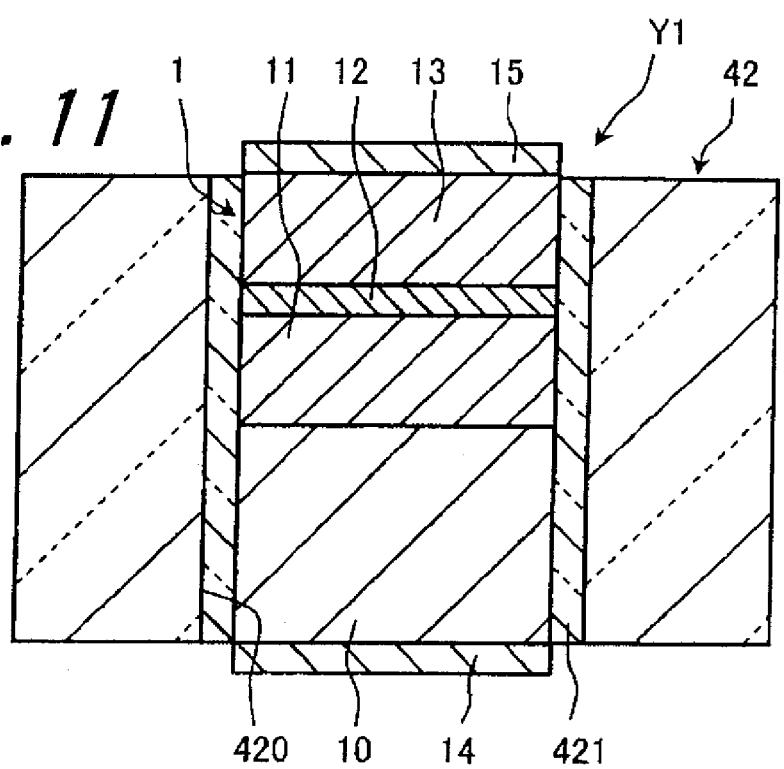
FIG. 11 is a longitudinal sectional view illustrating the light emitting device shown in FIG. 10.

A light emitting device Y1 shown in FIGS. 10 and 11 includes a light emitting chip 1 and an optical component 42 and is configured such that light is emitted from at least an outer surface of the optical component 42. The same components as in the light emitting device in the first embodiment shown in FIG. 1 will be denoted by the same reference numerals.

The optical component 42 is provided on a side surface 1B of the light emitting chip 1 through a glass bonding member 421. The optical component 42 has a function of protecting the light emitting chip 1 and also has a function of guiding light emitted from the light emitting chip 1 to the outside. The optical component 42 has a penetration space 420 in which the light emitting chip 1 is disposed and is formed in a tubular shape in which the entire optical component 42 has a transparency by glass. As a glass material for forming the optical component 42, for example, quartz glass, optical glass containing boric acid and silicic acid, crystal, sapphire, or fluorite may be used.

The penetration space 420 is formed in a rectangular parallelepiped shape corresponding to the appearance shape of the light emitting chip 1, and the light emitting chip 2 is disposed in the penetration space 420 in a state where the glass bonding member 421 is interposed between an inner surface of the penetration space 420 and a side surface of the light emitting chip 1. In a state where the light emitting chip 1 is disposed in the penetration space 420, a periphery of the substrate 10, the n-type semiconductor layer 11, the light emitting layer 12, and the p-type semiconductor layer 13 is surrounded by the optical component 42, and the entire light emitting device Y1 has an approximately rectangular parallelepiped shape.

However, the optical component 42 preferably covers a portion of a side surface of the light emitting chip 1 from which light is emitted, but it is not necessary to cover the entire side surface of the light emitting chip 1. For example, in the case where light is not emitted from the substrate 10, the optical component 42 may be formed in a shape in which, for example, a periphery of the n-type semiconductor layer 11, the light emitting layer 12, and the p-type semiconductor layer 13 is selectively surrounded.

In addition, in order to reduce reflection loss on an outer surface of the optical component 42, a diffraction grating having a conical shape, a cylindrical shape, a quadrangular prism shape, or the like is provided on the outer surface and the outer surface is made rough by surface treatment, such as blast treatment or chemical polishing. As a result, it is possible to further suppress the reflection loss and to efficiently guide light from the optical component 42 into external gas. In addition, the arithmetic mean roughness of the outer surface is preferably 0.1 to 100 μm. In the case where the arithmetic mean roughness is smaller than 0.1 μm and the case where the arithmetic mean roughness is larger than 100 μm, the reflection loss on the outer surface is not suppressed and light cannot be efficiently guided from the optical component 42 into external gas.

The glass bonding member 421 has a transparency and is formed of, for example, a material whose refractive index is smaller than that of the light emitting chip 1 and is larger than that of the optical component 42. As such a glass bonding member, sol-gel glass, low-melting-point glass, or a water glass adhesive is used, for example.

Figure 12:
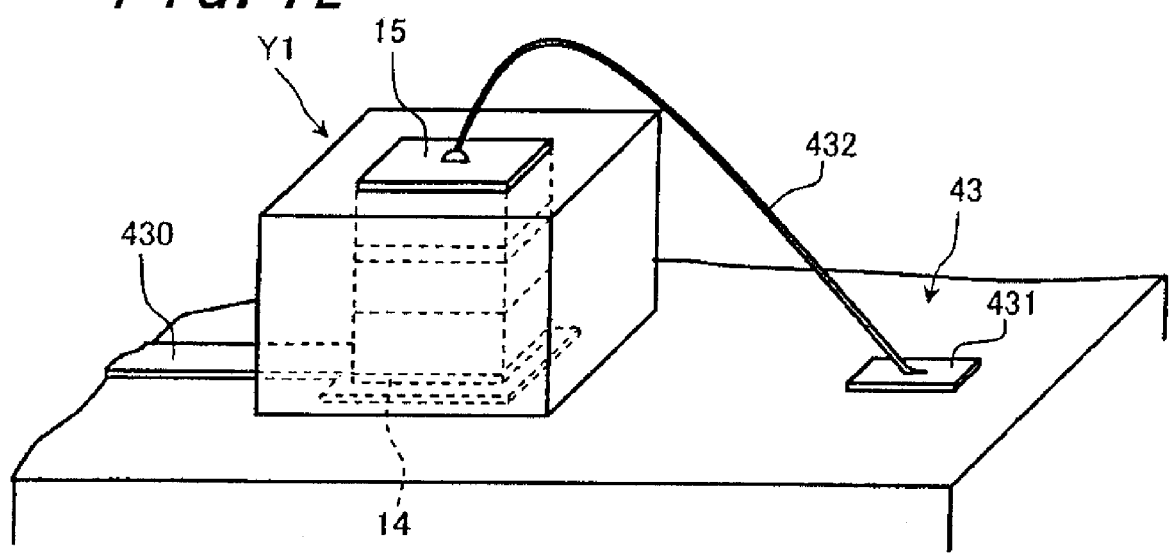
FIG. 12 is a perspective view for explaining an example of use of the light emitting device shown in FIGS. 10 and 11.

As shown in FIG. 12, the light emitting device Y1 is mounted on the circuit board 43 or the like and is used. In the drawing, an example in which the electrode 14 is conduction-connected to a wiring line 430 of the circuit board 43 through a conductive bonding member, such as solder, and the electrode 15 is conduction-connected to a wiring line 431 of the circuit board 43 through a wire 432 is shown.

Figure 28:
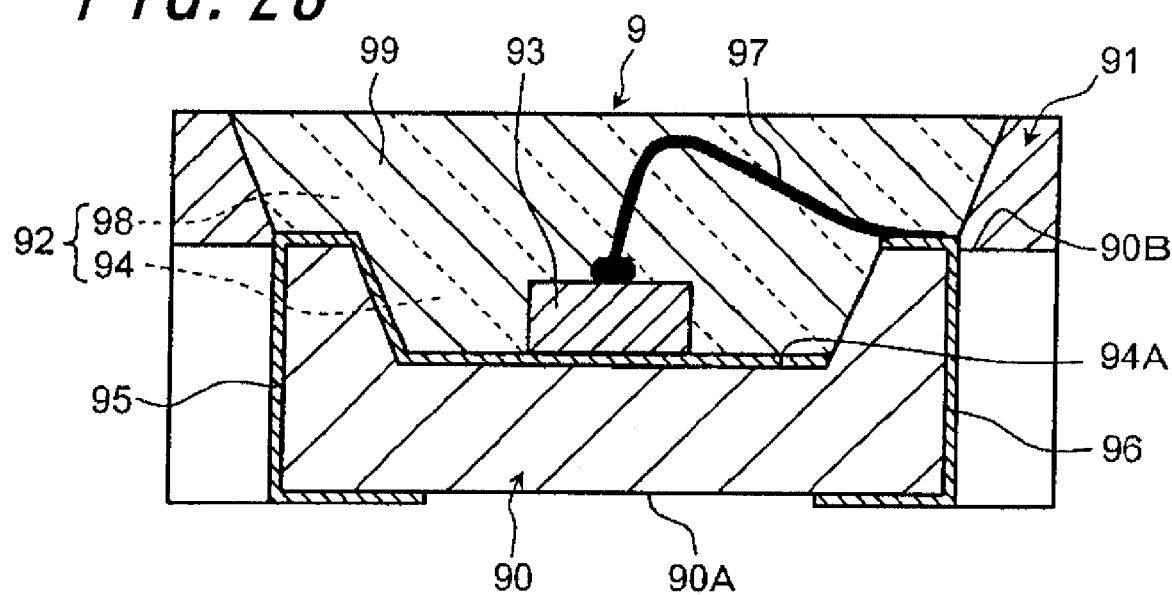
FIG. 28 is a cross-sectional view illustrating an example of a light emitting device in the related art.

In the light emitting device Y1, at least a part of the portion of the light emitting chip 1 from which light is emitted is surrounded by the optical component 42 formed of glass. On the other hand, glass is a material whose transmittance with respect to light having a wavelength of 230 nm to 400 nm is high compared with a resin, whose molecular structure is difficult to break by optical absorption, and whose transmittance or mechanical strength does not deteriorate easily. Accordingly, in the light emitting device Y1, even if light emitted from the light emitting chip 1 is absorbed in the periphery (optical component 42) of the light emitting chip 1, a possibility that the transmittance or the mechanical strength will deteriorate due to light energy is very low, compared with the known light emitting device 9 (refer to FIG. 28) in which the periphery of the light emitting chip 1 is protected by a resin. As a result, since a possibility that an element (optical component 42) which protects the light emitting chip 1 will deteriorate due to the light emitted from the light emitting chip 1 is reduced, a drop in the emission brightness of the light emitting device Y1 can be reduced. Thus, the light emitting device Y1 can output light stabilized over a long period of time. In addition, since the area of the light emitting device Y1 from which light is emitted is increased by the outer surface of the optical component 42, a probability that the light of the light emitting chip 1 having entered the optical component 42 is reflected on the outer surface while being guided to the external gas increases. As a result, the light of the light emitting chip 1 is efficiently guided from the optical component 42 to the external gas and the amount of light emitted from the light emitting device Y1 increases.

In addition, a possibility that gas will remain between the light emitting chip 1 and the optical component 42 is reduced by adopting the configuration in which the light emitting chip 1 and the optical component 42 come in contact with each other through the glass bonding member 421. Therefore, a possibility that light from the light emitting chip 1 will be reflected between the light emitting chip 1 and the optical component 42 is reduced compared with a case where gas remains between the light emitting chip 1 and the optical component 42. Thus, in the light emitting device Y1, light from the light emitting chip 1 can be efficiently emitted to the optical component 42. In addition, since a crack that is generated in the optical component 42 or the glass bonding member 421 in a manufacturing process of the light emitting device Y1 or a process of mounting the light emitting device Y1 onto the circuit board 43 or due to heat loaded in operation environment and a difference in thermal expansion coefficient between the respective members can be reduced, the light emitting device Y1 can output the light stabilized over a long period of time. Particularly in the case where the refractive index of the glass bonding member 421 is set smaller than that of the light emitting chip and larger than that of the optical component 42, since the reflection loss on the interface between the light emitting chip 1 and the glass bonding member 421 and the interface between the glass bonding member 421 and the optical component 42 can be suppressed, the light from the light emitting chip 1 can be more efficiently introduced to the optical component 42.

Fifth Embodiment

Next, a light emitting module according to a fifth embodiment of the invention will be described with reference to FIG. 13.

Figure 13:
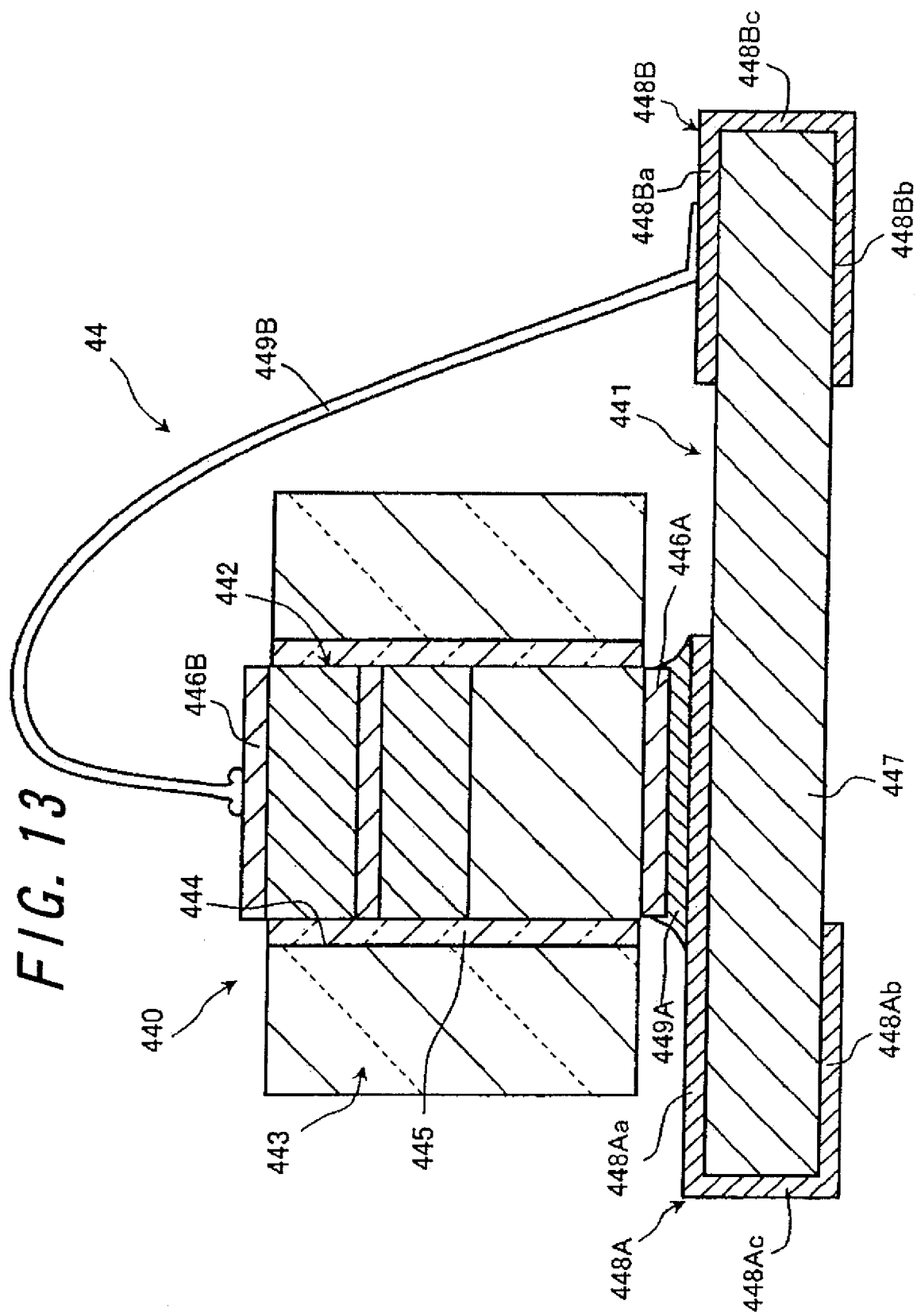
FIG. 13 is a cross-sectional view illustrating a light emitting module according to a fifth embodiment of the invention.

A light emitting module 4 shown in FIG. 13 is configured so as to be able to be surface mounted and includes a light emitting device 440 and a wiring substrate 441.

The light emitting device 440 is the same as the light emitting device Y1 (refer to FIGS. 10 and 11) according to the fourth embodiment of the invention and includes a light emitting chip 442 and an optical component 443.

The light emitting device 440 has a configuration in which a periphery of the light emitting chip 442 is surrounded by the optical component 443 when the light emitting chip 442 is disposed in a penetration space 444 of the optical component 443. A glass bonding member 445 is interposed between an inner surface of the penetration space 444 and a side surface of the light emitting chip 442 and the light emitting chip 442 is in contact with an inner surface of the optical component 443.

The light emitting chip 442 further includes electrodes 446A and 446B, and the electrodes 446A and 446B are exposed at upper and lower sides of the penetration space 444.

The optical component 443 is formed of glass and a refractive index thereof is smaller than that of the glass bonding member 445. On the other hand, the refractive index of the glass bonding member 445 is smaller than that of the light emitting chip 442. In addition, the same material as in the light emitting device Y1 (refer to FIGS. 10 and 11) described earlier may be used as a material for forming the optical component 443 and the glass bonding member 445.

On the other hand, in the wiring substrate 441, external connection conductors 448A and 448B are formed on a surface of an insulating substrate 447. The external connection conductors 448A and 448B have upper surface conductor portions 448Aa and 448Ba that are conduction-connected to the electrodes 446A and 446B of the light emitting chip 440, bottom surface conductor portions 448Ab and 448Bb that are conduction-connected to wiring lines of a mount object, such as a circuit board, and side surface conductor portions 448Ac and 448Bc that make connections between the upper surface conductor portions 448Aa and 448Ba and the bottom surface conductor portions 448Ab and 448Bb, respectively.

The upper surface conductor portion 448Aa is conduction-connected to the electrode 446A of the light emitting chip 442 through a conductive bonding member 449A, such as solder or a conductive resin. On the other hand, the upper surface conductor portion 448Ba is conduction-connected to the electrode 446B of the light emitting chip 442 through a wire 449B.

In the light emitting device 44, the light emitting chip 442 is surrounded by the optical component 443 formed of glass, and the glass bonding member 445 is interposed between an inner surface of the optical component 443 (penetration space 444) and a side surface of the light emitting chip 442. Therefore, similar to the light emitting device Y1 (refer to FIGS. 10 and 11) described earlier, light emitted from the light emitting chip 442 can be efficiently guided to the optical component 443. In addition, since the refractive index of the glass bonding member 445 is smaller than that of the light emitting chip 442 and the refractive index of the optical component 443 is smaller than that of the glass bonding member 445, the reflection loss on each interface between the light emitting chip 442 or the glass bonding member 445 and the optical component 443 or the air can be suppressed by gradually reducing the refractive index from the light emitting chip 442, for example, over the air whose refractive index is 1. As a result, since the light from the light emitting chip 442 can be more efficiently emitted to the outside, the optical output of the light emitting device 440 can be improved.

Sixth Embodiment

Next, a light emitting module according to a sixth embodiment of the invention will be described with reference to FIG. 14. Here, in FIG. 14, the same members or elements as in the light emitting module 4 described with reference to FIG. 13 will be denoted by the same reference numerals, and a repeated explanation will be omitted.

Figure 14:
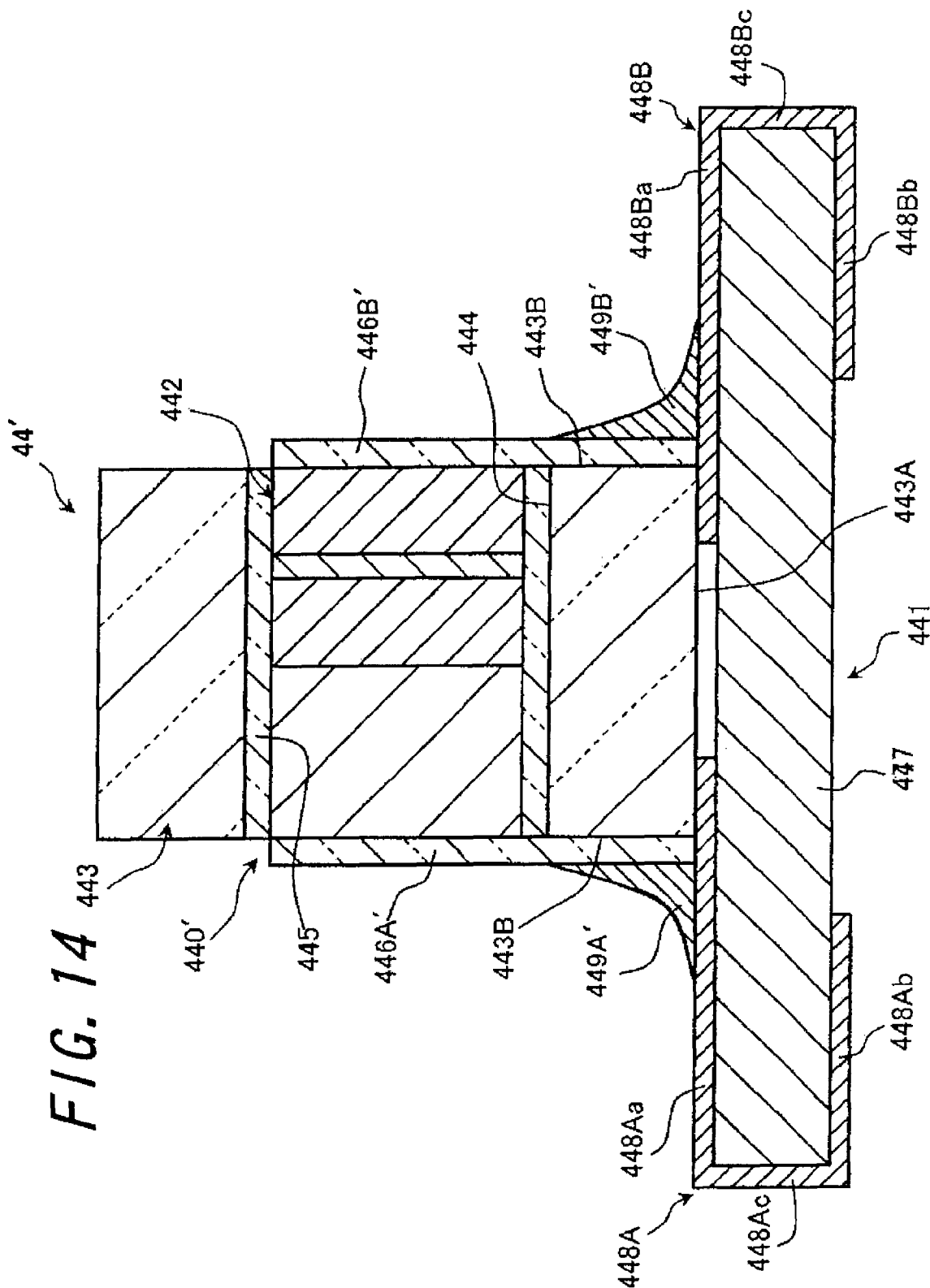
FIG. 14 is a cross-sectional view illustrating a light emitting module according to a sixth embodiment of the invention.
Figure 15:
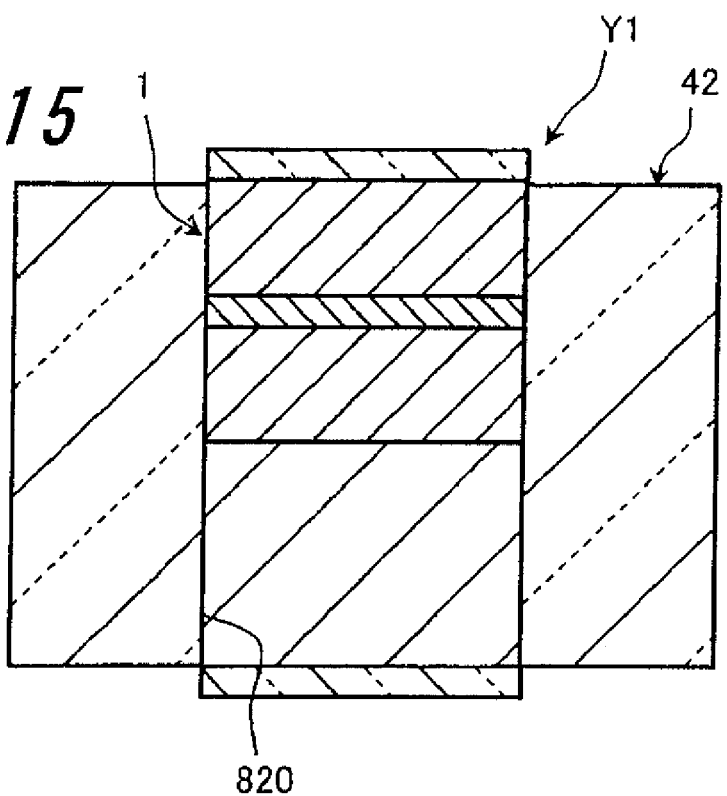
FIG. 15 is a longitudinal sectional view illustrating another example of a light emitting device.

A light emitting module 44' shown in FIG. 14 includes a light emitting device 440' and a wiring substrate 441 and is the same as the light emitting module 44 (refer to FIG. 13) described earlier in a point that surface mounting is possible. On the other hand, the light emitting module 44' is different from the light emitting module 44 in a point that the light emitting device 440' is mounted such that an outer surface 443A of the optical component 443 faces the wiring substrate 441.

In addition, the light emitting device 440' has basically the same configuration as the light emitting devices Y1 and 440 (refer to FIGS. 10, 11, and 13) described earlier, but the light emitting device 440' is different from the light emitting devices Y1 and 440 in the configuration of electrodes 446A' and 446B'. That is, the electrode 446A' and 446B' are provided to extend up to a surface 443B of the optical component 443 so as to be reliably conduction-connected to the upper surface conductor portions 448Aa and 448Ba of the external connection conductors 448A and 448B in the wiring substrate 441. In addition, the light emitting device 440' is mounted on the wiring substrate 441 in a form that the electrodes 446A' and 446B' extend downward from the light emitting chip 442, and the electrodes 446A' and 446B' and the upper surface conductor portion 448Aa and 448Ba are conduction-connected to each other through conductive bonding members 449A' and 449B'.

In the light emitting device 440' of the light emitting module 44', similar to the previous light emitting devices Y1 and 440 (refer to FIGS. 10, 11, and 13), light emitted from the light emitting chip 442 is transmitted through a glass bonding member and is guided to the optical component 443 efficiently and optical absorption caused by the wire 449B in the light emitting device 440 shown in FIG. 13 is eliminated. As a result, on an irradiation surface when the light emitting device 440' is used as an illuminating apparatus, the shadow of the wire 449B disappears and light emitted upward from the outer surface of the optical component 443 increases. As a result, the brightness in the light emitting device 440' and the light emitting module 441 can be improved.

The light emitting devices and the light emitting devices adopted in the light emitting modules according to the fourth to sixth embodiments are not limited to those described with reference to FIGS. 10 to 14, but various modifications may also be made. For example, the light emitting devices may be made to have the configurations shown in FIGS. 15 to 18. Also in this case, the same operation and effect as in the previous light emitting device Y1 (refer to FIGS. 10 and 11) can be obtained.

Figure 16:
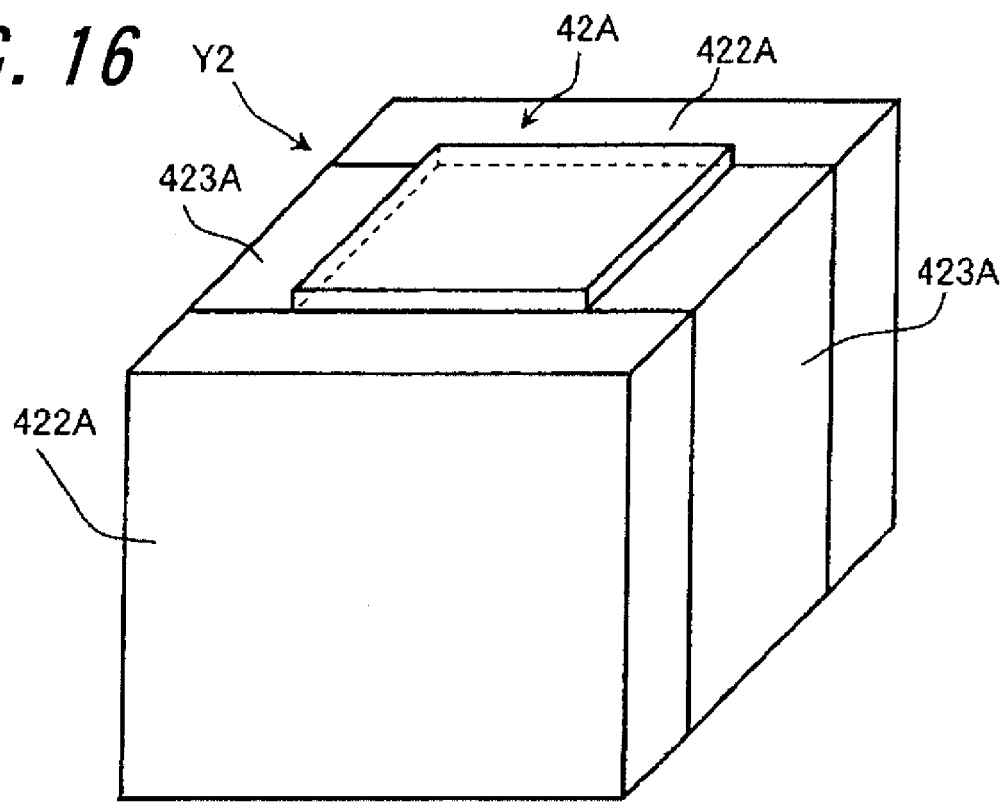
FIG. 16 is an entire perspective view illustrating another example of a light emitting device.

In a light emitting device Y2 shown in FIG. 16, an optical component 442A is configured to include four plate-shaped elements 422A and 423A and the entire optical component 442A is formed in an approximately rectangular parallelepiped shape. In the light emitting device Y2, the optical component 442A is configured to include the four plate-shaped elements 422A and 423A, but the function is the same as that of the optical component 42 (refer to FIGS. 10 and 11) formed in the tubular shape.

Figure 17:
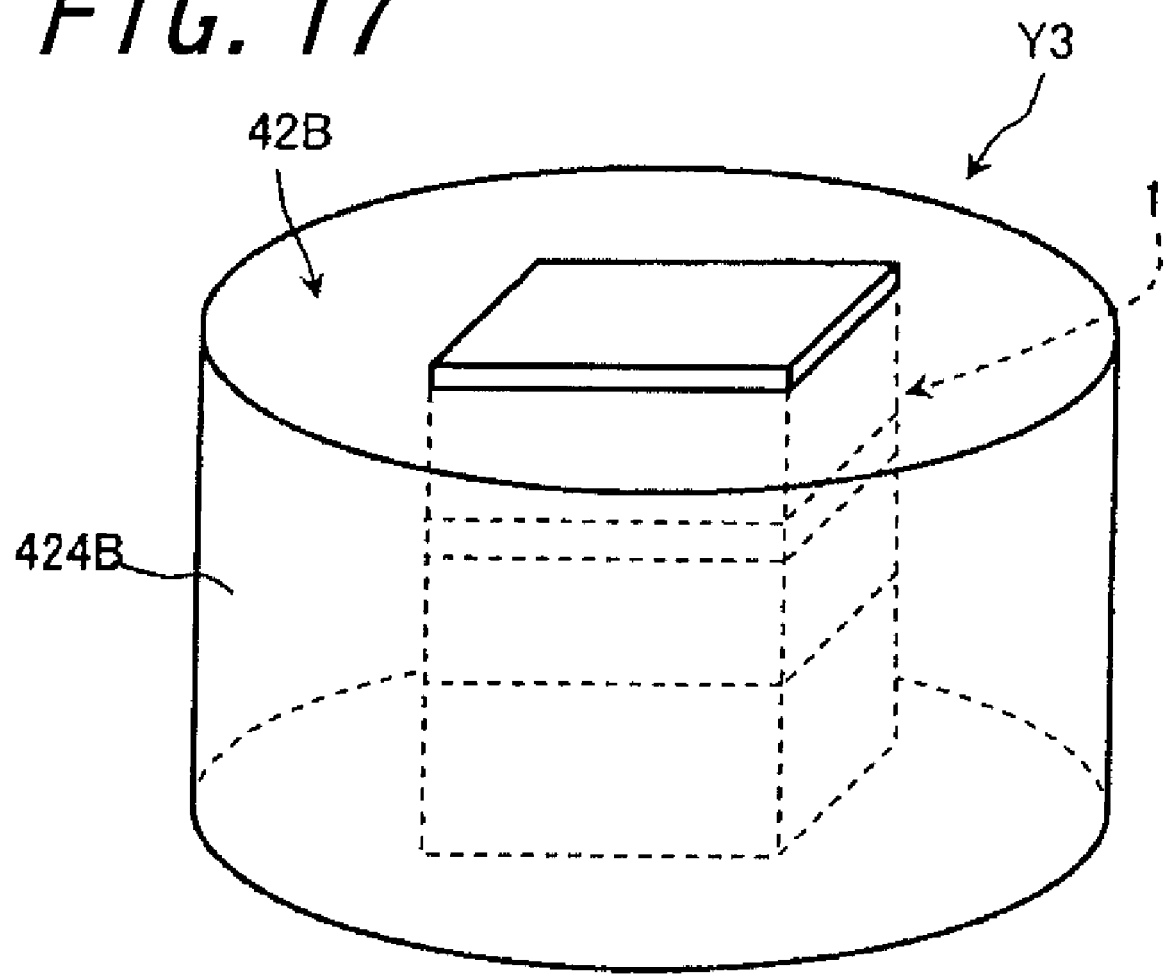
FIG. 17 is an entire perspective view illustrating another example of a light emitting device.

In a light emitting device Y3 shown in FIG. 17, an optical component 42B is formed in a cylindrical shape. In such a light emitting device Y3, an outer surface 424B of the optical component 42B is a curved surface. Accordingly, the light emitted from the light emitting chip 1 can be emitted from the outer surface 424B of the optical component 42B approximately uniformly.

In light emitting devices Y4 and Y5 shown in FIG. 18(*a*) and FIG. 18(*b*), fluorescence materials 425 are dispersed in optical components 42C and 42D. In the light emitting device Y4 shown in FIG. 18(*a*), the fluorescence materials 425 are dispersed in the entire optical component 42C. In the light emitting device Y5 shown in FIG. 18(*b*), the fluorescence materials 425 are selectively dispersed on an outer surface part of the optical component 42D.

The fluorescence materials 425 contained in the optical components 42C and 42D are selected according to the wavelength (color) of light to be emitted from the light emitting devices Y4 and Y5. For example, in the case where white light is emitted from the light emitting devices Y4 and Y5, a first fluorescence material that converts light emitted from the light emitting chip 1 into light having a peak of emission intensity in a wavelength range of 400 to 500 nm, a second fluorescence material that converts the light emitted from the light emitting chip 1 into light having a peak of emission intensity in a wavelength range of 500 to 600 nm, and a third fluorescence material that converts the light emitted from the light emitting chip 1 into light having a peak of emission intensity in a wavelength range of 600 to 700 nm are used as the fluorescence materials 425. As the first fluorescence material, for example, $(Sr, Ca, Ba, Mg)_{10}(PO_4)_6Cl_2$:Eu or $BaMgAl_{10}O_{17}$:Eu may be mentioned. As the second fluorescence material, for example, $SrAl_2O_4$:Eu or ZnS:Cu, Al or $SrGa_2S_4$:Eu may be mentioned. As the third fluorescence material, for example, SrCaS:Eu, $La_2O_2S$:Eu or $LiEuW_2O_8$ may be mentioned.

On the other hand, in the cases when the white light is emitted from the light emitting devices Y4 and Y5 by using the first to third fluorescence materials, for example, one that emits light having at least one peak of emission intensity in a wavelength range of 230 to 400 nm is used as the light emitting chip 1. As the light emitting chip 1, for example, a ZnO-based oxide semiconductor light emitting diode may be mentioned.

In addition, it may also be possible to make the light emitting devices Y4 and Y5 emit white light by using one that emits blue light as the light emitting chip 1 and using, as the fluorescence materials 425, ones that convert blue light into yellow light, for example, an yttrium aluminum garnet-based fluorescence material (YAG) activated by cerium (Ce) or an alkaline earth metal orthosilicate fluorescence material activated by bivalent europium (Eu).

In the light emitting device Y4 shown in FIG. 18(a), the optical component 42C in which the fluorescence materials 425 are dispersed can be easily formed since the fluorescence materials 425 are dispersed in the entire optical component 42C. That is, the light emitting device Y4 is advantageous in that the optical component 42C can be easily manufactured. On the other hand, in the light emitting device Y5 shown in FIG. 18(b), an optical path difference between light horizontally propagating through the optical component 42D and light propagating in a direction inclined from the horizontal direction is reduced since the fluorescence materials 425 are selectively dispersed on the outer surface part of the optical component 42D. As a result, since a difference in wavelength conversion amount between the light transmitted in the horizontal direction and the light transmitted obliquely is reduced, a part of light emitted from the light emitting chip 1 is transmitted as it is and the wavelength of a part of light is converted. Accordingly, in the case where a mixed color thereof is emitted, color unevenness is suppressed, which allows light having a uniform color to be emitted from the entire device. In addition, since the light emitted from the light emitting chip 1 efficiently enters the optical component 42D without being blocked by the fluorescence materials 425, the fluorescence materials 425 excited by the light of the light emitting chip 1 increases and the optical output of the light emitting device Y5 increases.

It is needless to say that the light emitting devices Y4 and Y5 may also be configured to emit light with a color other than the white color by appropriately selecting the type of the fluorescence material 425 used. Alternatively, a wavelength conversion layer containing fluorescence materials may be provided on the outer surfaces of the optical components 42C and 42D instead of dispersing the fluorescence materials 425 in the optical components 42C and 42D.

Seventh Embodiment

Next, a light emitting module according to a seventh embodiment of the invention will be described with reference to FIGS. 19 and 20.

Figure 19:
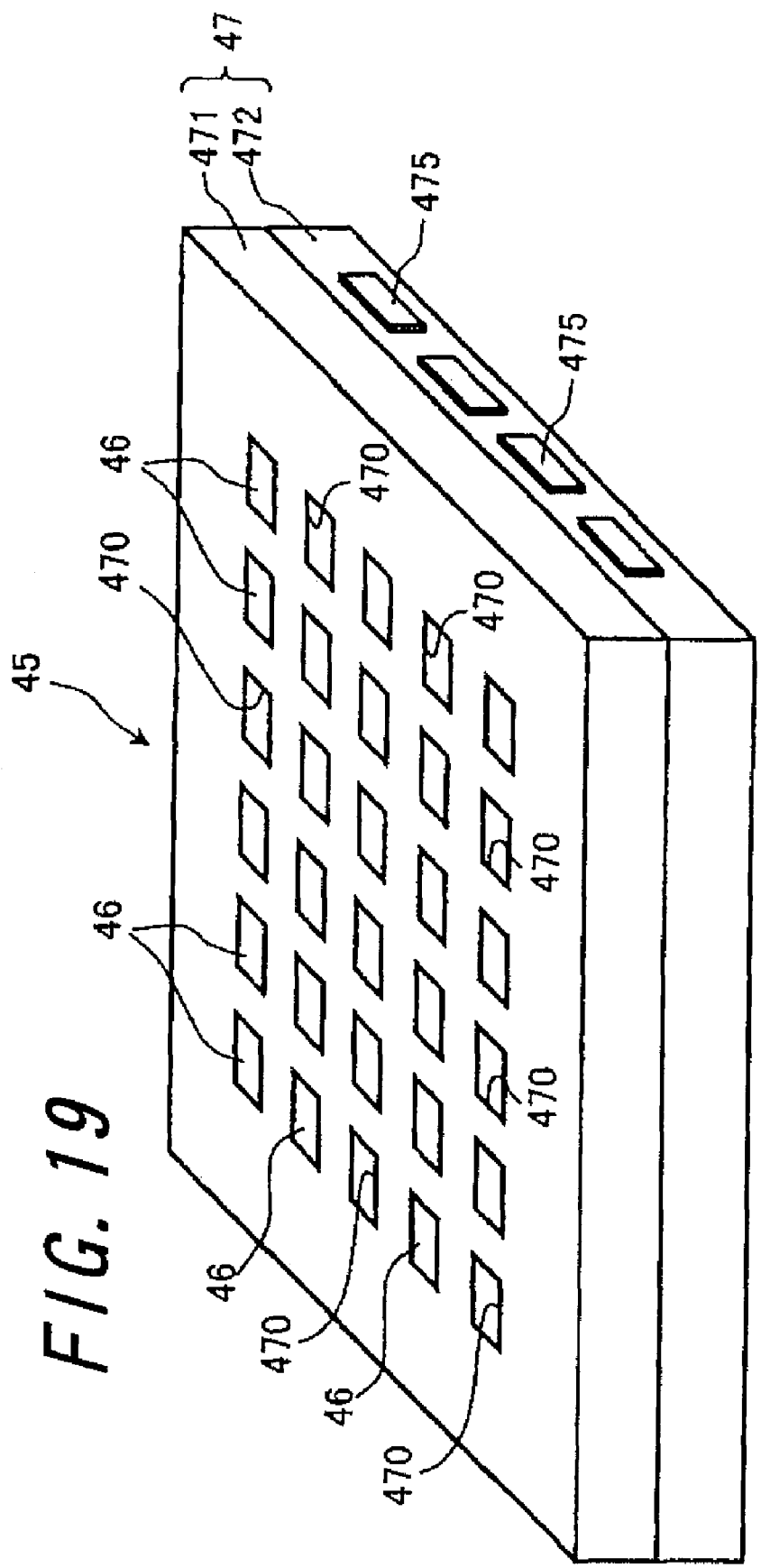
FIG. 19 is an entire perspective view illustrating a light emitting module according to a seventh embodiment of the invention.
Figure 20:
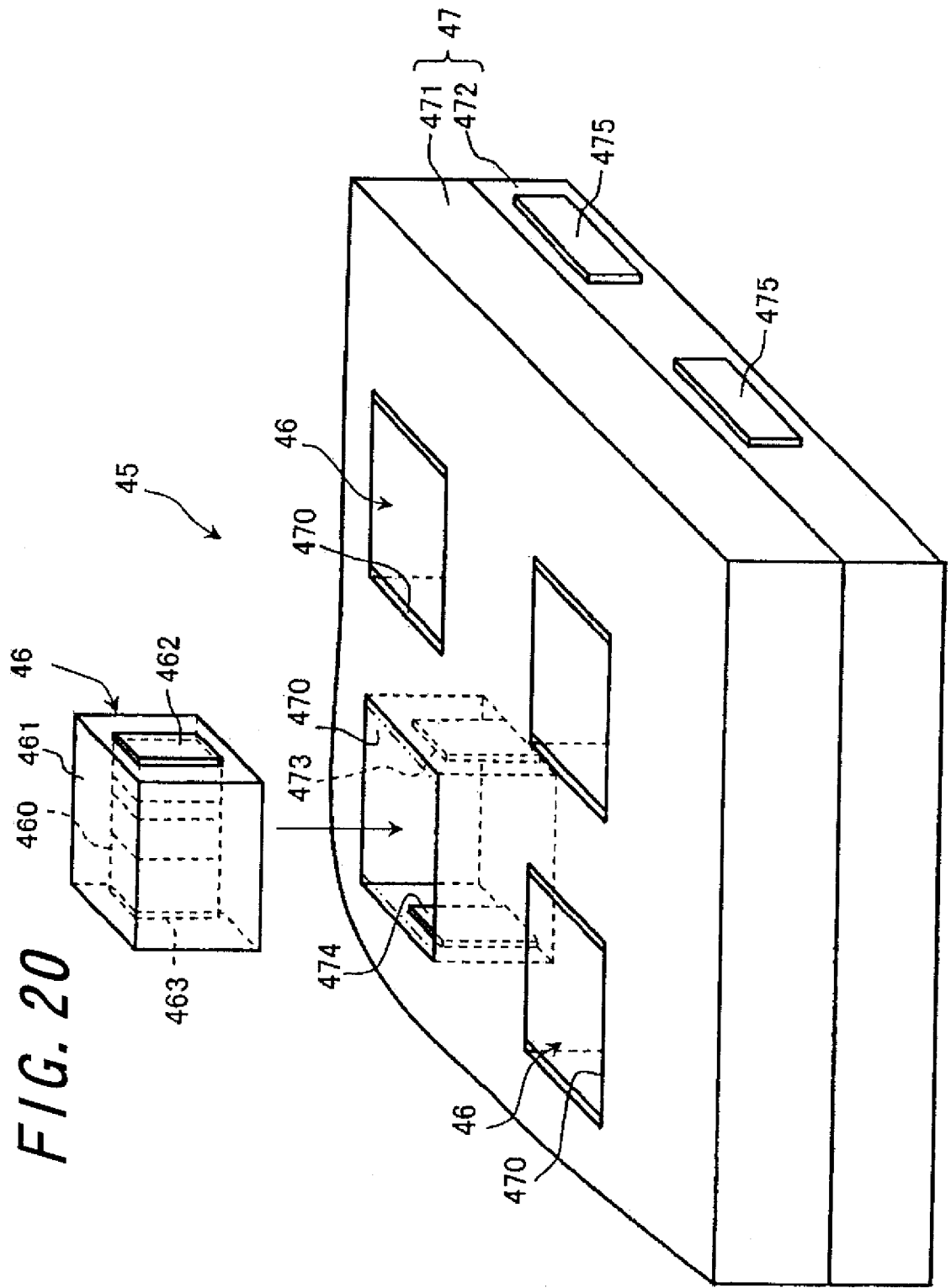
FIG. 20 is an exploded perspective view illustrating a part of main components of the light emitting module shown in FIG. 19.

A light emitting module 45 shown in FIGS. 19 and 20 may be used as an illuminating apparatus or a display apparatus and includes a plurality of light emitting devices 46 and an insulating substrate 47.

Similar to the light emitting devices Y1 and Y2 (refer to FIGS. 10, 11, and 16) described earlier, a periphery of a light emitting chip 460 is surrounded by an optical component 461 in each of the plurality of light emitting devices 46, and the entire light emitting device 46 is formed in the rectangular parallelepiped shape. As the light emitting device 46, according to the object, one in which fluorescence materials are contained in the optical component 461 is used (refer to the light emitting devices Y4 and Y5 shown in FIG. 18(a) and FIG. 18(b)).

The insulating substrate 47 serves to fix the plurality of light emitting devices 46 by positioning and supply driving power to each light emitting device 46. The insulating substrate 47 has a first substrate 471 in which a plurality of through holes 470 are formed and a second substrate 472 in which wiring lines (not shown) are patterned and formed.

The plurality of through holes 470 of the first substrate 471 are space where the light emitting devices 46 are disposed and are disposed in a matrix. A pair of terminals 473 and 474 for contact with electrodes 462 and 463 of the light emitting device 46 are provided on an inner surface of each through hole 470 so as to be opposite to each other. That is, in a state where the light emitting device 46 is disposed in each through hole 470, the plurality of light emitting devices 46 are disposed in a matrix and the electrodes 462 and 463 of each light emitting device 46 and the pair of terminals 473 and 474 of the through hole 470 are in a state where conduction connection therebetween is made.

Wiring lines (not shown) of the second substrate 472 are conduction-connected to the pair of terminals 473 and 474 of the first substrate 471. In addition, the wiring lines are conduction-connected to terminals 75 provided on a side surface of the second substrate 472. The pattern of wiring lines is designed according to a driving mode of the plurality of light emitting devices 46 in the light emitting module 45, for example.

For example, in the case where the light emitting module 45 is configured as a display apparatus, each light emitting device 6 can be driven individually. Accordingly, the wiring lines are patterned and formed such that each light emitting device 46 can be driven individually. On the other hand, in the case where the light emitting module 45 is configured as an illuminating apparatus, each light emitting device 46 does not necessarily need to be configured to be driven individually but, for example, all parts may simultaneously driven or the plurality of light emitting devices 46 may be divided into a plurality of groups so as to be able to be driven for every group. Accordingly, the wiring lines are patterned and formed such that such driving is possible.

In the light emitting module 45, the same one as the light emitting devices Y1, Y2, Y4, and Y5 (refer to FIGS. 10, 11, 16, 18(a), and 18(b)) described earlier is used as the light emitting device 46. That is, in the light emitting chip 46, deterioration of the optical component 461 due to light from the light emitting chip 460 is suppressed and volume contraction of each member in a manufacturing process of the light emitting device 46 is limited only to the glass bonding member 421 that can make the volume small compared with the light emitting chip 460 or the optical component 461. Accordingly, the optical component 461 is mounted in the periphery of the light emitting chip without generating a crack in the glass bonding member 421. As a result, in the light emitting module 45 which uses the light emitting device 46, it becomes possible to output the light stabilized over a long period of time.

In addition, in the light emitting module 45, although the plurality of through holes 470 are provided in the first substrate 471 and the light emitting devices 46 are disposed in the through holes 470. However, the light emitting devices 46 may be simply mounted on a surface of the insulating substrate.

Eighth Embodiment

Next, a light emitting device according to an eighth embodiment of the invention will be described with reference to FIGS. 21 and 22.

Figure 21:
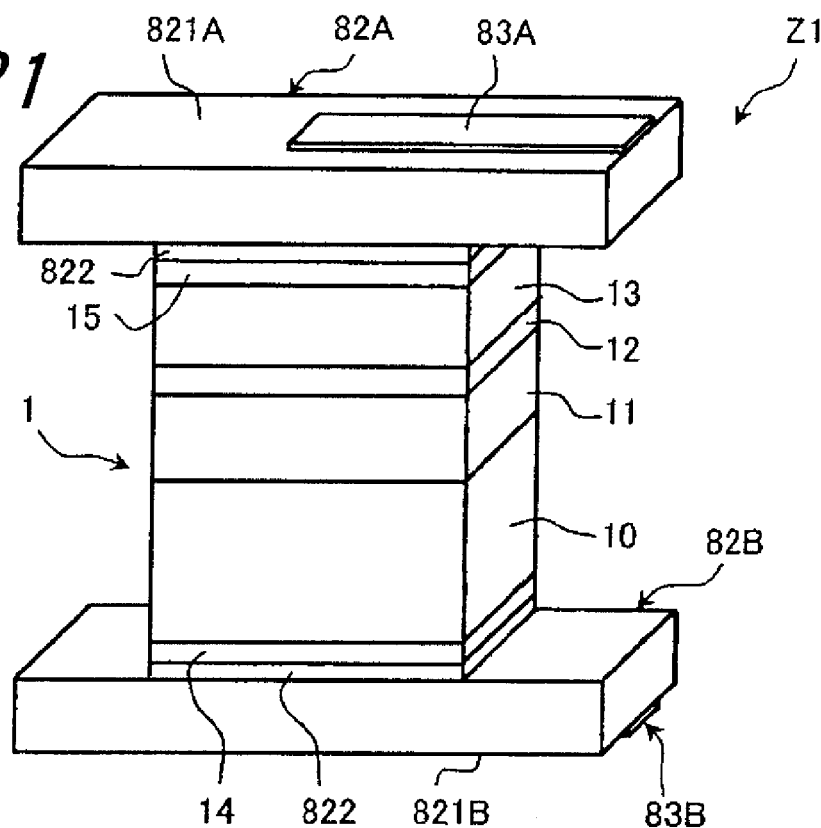
FIG. 21 is an entire perspective view illustrating a light emitting device according to an eighth embodiment of the invention.
Figure 22:
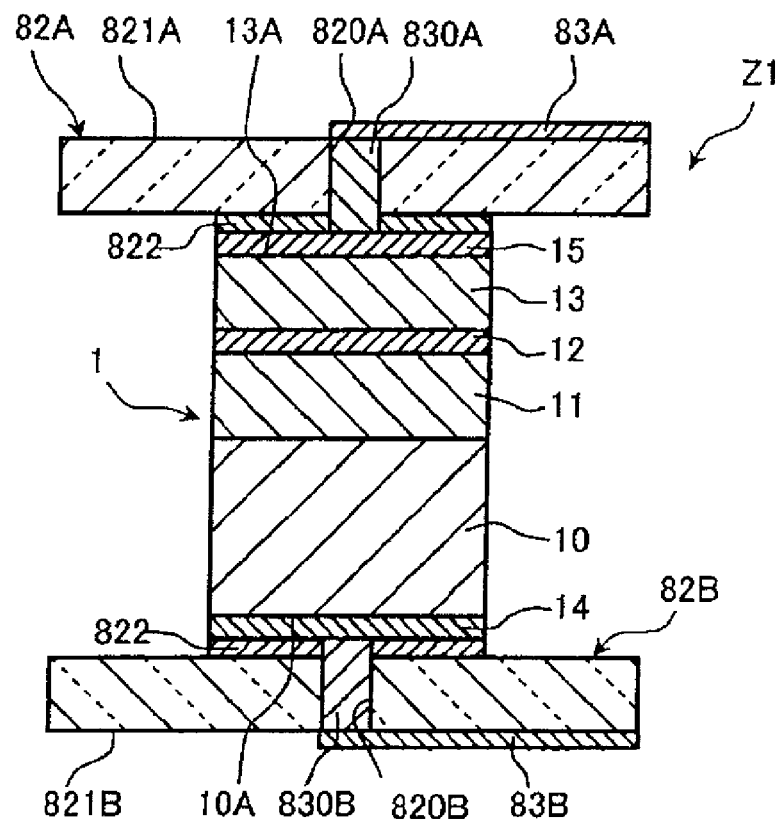
FIG. 22 is a longitudinal sectional view illustrating the light emitting device shown in FIG. 21.

A light emitting device Z1 shown in FIGS. 21 and 22 includes the light emitting chip 1, first and second optical components 82A and 82B, and first and second external connection terminals 83A and 83B and is configured such that light is emitted from at least an outer surface of the first optical component 82A.

Each of the first and second optical components 82A and 82B has a function of protecting the light emitting chip 1 and has a function of guiding light emitted from the light emitting chip 1 to the outside. In addition, each of the first and second optical components 82A and 82B also has a function of increasing the emission area of an emission source in the light emitting device Z1. That is, the light emitted from the light emitting chip 1 efficiently enters the first and second optical components 82A and 82B through a glass bonding member 822, a refractive index difference between the glass bonding member 822 and the light emitting chip 1 being made small. In addition, the light emitted from the light emitting chip 1 is efficiently emitted to the outside through the first and second optical components 82A and 82B, which improve the probability that the light is taken out by increasing the emission area, while being irregularly reflected within the first and second optical components 82A and 82B. In addition, the first and second optical components 82A and 82B have through holes 820A and 820B in middle portions thereof, respectively, and are formed in the plate shapes with a transparency. First and second relay conductors 830A and 830B are formed so as to be filled into the through holes 820A and 820B. The first and second relay conductors 830A and 830B are provided for conduction connection between the first and second chip electrodes 14 and 15 of the light emitting chip 1 and the first and second external connection terminals 83A and 83B and pass through the first and second optical components 82A and 82B in the thickness direction thereof, respectively, and end surfaces thereof are exposed from surfaces 21A and 821B of the first and second optical components 82A and 82B.

The first and second optical components 82A and 82B are formed of an inorganic material having a transparency entirely and are bonded to the first and second chip electrodes 14 and 15 through the glass bonding member 822. The first and second optical components 82A and 82B are disposed in a parallel state so as to face each other. The glass bonding member 822 has a transparency and is formed of, for example, a material whose refractive index is smaller than that of the light emitting chip 1 and is larger than that of the optical component 82.

Here, as a transparent inorganic material for forming the optical component 82, for example, quartz glass, optical glass (borosilicate glass) containing boric acid and silicic acid, crystal, sapphire, or fluorite may be used. On the other hand, as the glass bonding member 822, a bonding member formed of a transparent inorganic material, such as sol-gel glass, water glass, and low-melting-point glass, which has high transmittance with respect to light having a wavelength of 230 nm to 450 nm and is mineralized using fusion or hydrolysis reaction may be used.

The first and second external connection terminals 83A and 3B are portions for conduction connection to wiring lines of a mounting board when the light emitting device Z1 is mounted on the mounting board, such as a wiring substrate, and are formed in strip shapes extending from middle portions of the surfaces 821A and 821B of the first and second optical components 82A and 82B to side edges. The first and second external connection terminals 83A and 3B are conduction-connected to the first and second chip electrodes 14 and 15 of the light emitting chip 1 through the first and second relay conductors 830A and 830B.

In the light emitting device Z1, a bottom surface 10A (first chip electrode 14) of the substrate 10 of the light emitting chip 1 and a top surface 13A (second chip electrode 15) of the p-type semiconductor layer 13 are covered by the first and second optical components 82A and 82B formed of an inorganic material having a transparency with the glass bonding member 822 interposed therebetween. In general, glass is a material whose transmittance or mechanical strength does not easily deteriorate compared with a resin. Therefore, even if the light emitted from the light emitting chip 1 is transmitted through the first and second optical components 82A and 82B and the light from the light emitting chip 1 is absorbed in the first and second optical components 82A and 82B, a possibility that the transmittance and mechanical strength of each of the first and second optical components 82A and 82B will deteriorate due to radiant energy that the light has is very low. As a result, in the light emitting device Z1, a possibility that elements (first and second optical components 82A and 828) which protect the light emitting chip 1 will deteriorate due to the light from the light emitting chip 1 is reduced compared with the known light emitting device 9 (refer to FIG. 28) in which a light emitting chip is protected by a resin. Accordingly, a reduction in radiant energy, radiant flux, and radiant intensity of emitted light is suppressed. Thus, the light emitting device Z1 can output light stabilized over a long period of time.

In addition, a possibility that gas will remain between the light emitting chip 1 and the first and second optical components 82A and 82B is reduced by adopting the configuration in which the light emitting chip 1 and the first and second optical components 82A and 82B come in contact with each other through the glass bonding member 822. Therefore, a possibility that the light from the light emitting chip 1 will be reflected and scattered between the light emitting chip 1 and the first and second optical components 82A and 82B is reduced compared with a case where gas remains between the light emitting chip 1 and the first and second optical components 82A and 82B. Thus, in the light emitting device Z1, the light from the light emitting chip 1 can be efficiently introduced to the first and second optical components 82A and 82B. Particularly in the case where the refractive index of the glass bonding member 822 is set smaller than that of the light emitting chip and larger than those of the first and second optical components 82A and 82B, since the reflection loss caused by total reflection on the interface between the light emitting chip 1 and the glass bonding member 822 is reduced and total reflection according to the Snell's law is suppressed on the interface between the glass bonding member 822 and the first and second optical components 82A and 82B, the light from the light emitting chip 1 can be more efficiently introduced to the optical component 82.

Furthermore, in the light emitting device Z1 of the invention, the glass bonding member 822 having a function of protecting the light emitting chip 1 and a function of taking out light from the inside of the light emitting chip 1 efficiently is not attached to cover the entire light emitting chip 1. Accordingly, a crack to the glass bonding member 822 generated in a manufacturing process of the light emitting device Z1 or when operating the light emitting device Z1 is suppressed. That is, in the manufacturing process of the light emitting device Z1 or in the case of operating the light emitting device Z1, a crack is generated due to volume contraction of the glass bonding member 822 in mineralizing sol-gel glass, water glass, or low-melting-point glass, for example, using fusion or hydrolysis reaction or due to a difference in thermal expansion coefficient between the light emitting chip 1 and the glass bonding member 822. Particularly when covering the entire light emitting chip 1 with the transparent glass bonding member 822, a crack is easily generated in the glass bonding member 822 with the periphery of the light emitting chip 1 as a base point since the volume of the glass bonding member becomes very larger than that of the light emitting chip 1. As a result, the light emitted from the light emitting chip 1 is absorbed and scattered by the crack generated in the glass bonding member 822 and the radiant energy, radiant flux, and radiant intensity of the light emitted from the light emitting device Z1 are reduced. Therefore, in the light emitting device Z1 of the invention, since the first and second optical components 82A and 82B are attached through the glass bonding member 822 provided in a portion of the light emitting chip 1, deterioration of the transmittance or mechanical strength of the glass bonding member 822 can be suppressed and a crack generated in the first and second optical components 82A and 82B or the glass bonding member 822 can be suppressed. This makes it possible to normally operate the light emitting device over a long period of time.

In addition, it is preferable that the thickness of the glass bonding member 822 be equal to or larger than 0.1 mm and equal to or smaller than 1.5 mm. In the case where the thickness of the glass bonding member 822 is smaller than 0.1 mm, the volume contraction, thermal expansion, or thermal contraction of the glass bonding member 822 in a manufacturing process of the light emitting device Z1 or when operating the light emitting device Z1 can be made very small, but the bonding strength or mechanical strength of the glass bonding member 822 becomes significantly reduced. Accordingly, the first and second optical components 82A and 82B easily peel off from the light emitting chip 1 by a physical impact on the first and second optical components 82A and 82B or the light emitting device Z from the outside. As a result, the light emitting device Z1 cannot operate normally. In addition, in the case where the thickness of the glass bonding member 822 is larger than 1.5 mm, the volume contraction of the glass bonding member 822 in the manufacturing process of the light emitting device Z1 or when operating the light emitting device Z1 becomes large and a stress occurring due to a difference in thermal expansion coefficient between the light emitting chip 1 and the glass bonding member 822 becomes large. As a result, since a crack is generated in the glass bonding member 822, the light emitting device Z1 cannot operate normally. For this reason, it is preferable that the thickness of the glass bonding member 822 be equal to or larger than 0.1 mm and equal to or smaller than 1.5 mm, such that the light emitting chip 1 and the first and second optical components 82A and 82B can be firmly bonded to each other and a crack generated in the manufacturing process of the light emitting device Z1 or when operating the light emitting device Z1 can be suppressed.

Ninth Embodiment

Next, a light emitting module according to a ninth embodiment of the invention will be described with reference to FIG. 23.

Figure 23:
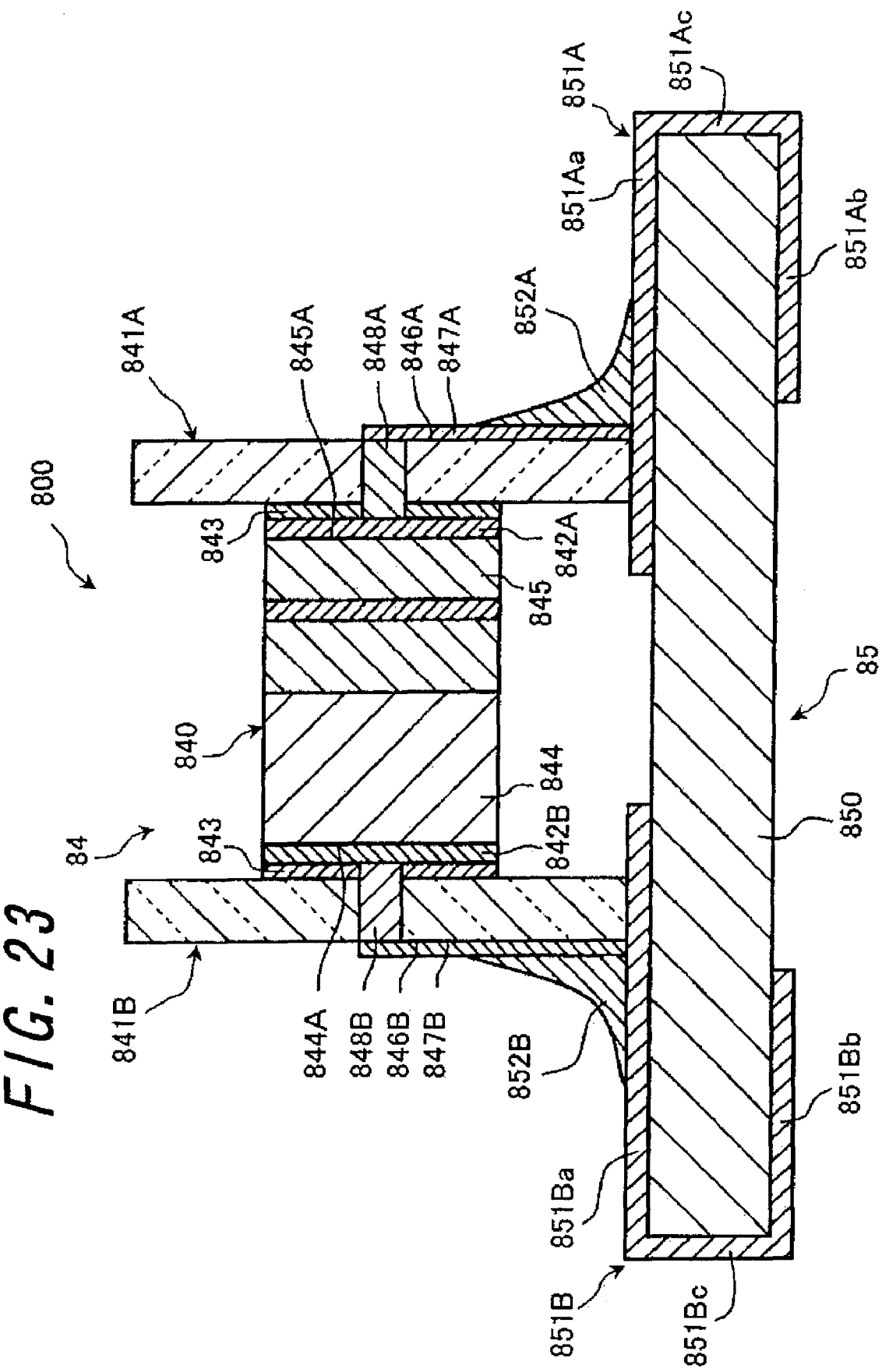
FIG. 23 is a longitudinal sectional view illustrating a light emitting module according to a ninth embodiment of the invention.

A light emitting module 800 shown in FIG. 23 is configured so as to be able to be surface mounted and includes a light emitting device 4 and a wiring line 85. That is, the light emitting device 4 is the same as the light emitting device Z1 (refer to FIGS. 21 and 22) according to the fourth embodiment of the invention described earlier and includes a light emitting chip 840 and optical components 841A and 841B.

In the light emitting device 4, by bonding the first and second optical components 841A and 841B on surfaces of first and second chip electrodes 842A and 842B of the light emitting chip 840 with a glass bonding member 843 interposed therebetween, a bottom surface 844A (second chip electrode 42B) of a substrate 844 of the light emitting chip 840 and a top surface 45A (first chip electrode 42A) of a p-type semiconductor layer 45 are covered by the first and second optical components 841A and 841B in contacted states.

The first and second optical components 841A and 8415 are formed of a transparent inorganic material and the refractive indexes thereof are larger than that of the glass bonding member 843. On the other hand, the refractive index of the glass bonding member 843 is smaller than that of the light emitting chip 840. In addition, the same material as in the light emitting device Z1 (refer to FIGS. 21 and 22) described earlier may be used as a material for forming the first and second optical components 841A and 841B and the glass bonding member 843.

On surfaces 846A and 846B of the first and second optical components 841A and 841B, first and second external connection terminals 847A and 847B which extend from middle portions of the surfaces 846A and 846B to side edges and have strip shapes are provided. The first and second external connection terminals 847A and 847B are conduction-connected to the first and second chip electrodes 842A and 842B of the light emitting chip 840 through first and second relay conductors 848A and 848B.

On the other hand, the wiring line 85 is obtained by forming first and second external connection conductors 851A and 851B on a surface of an insulating substrate 850. The first and second external connection conductors 851A and 851B have upper surface conductor portions 851Aa and 851Ba that are conduction-connected to the first and second external connection terminals 847A and 847B of the light emitting chip 4, bottom surface conductor portions 851Ab and 851Bb that are conduction-connected to wiring lines of a mount object, such as a circuit board, and side surface conductor portions 851Ac and 851Bc that make connections between the upper surface conductor portions 851Aa and 851Ba and the bottom surface conductor portions 851Ab and 851Bb, respectively. The conduction connection between the upper surface conductor portions 851Aa and 851Ba and the first and second external connection terminals 847A and 847B is performed by using conductive bonding members 852A and 852B, such as solder or a conductive resin.

In the light emitting module 800, the same one as the light emitting device Z1 (refer to FIGS. 21 and 22) described earlier is used as a light emitting device 84. Therefore, in the light emitting module 800, the radiant energy, radiant flux, and radiant intensity of the light emitted from the light emitting device Z1 is difficult to be reduced by radiant energy of light emitted from the light emitting chip 840 and the light emitted from the light emitting chip 840 can be efficiently guided to the first and second light optical components 841A and 841B.

In addition, since the light emitted from the light emitting chip 840 is emitted directly to the outside from the inside of the light emitting chip 840 and is emitted in all directions through the first and second light optical components 841A and 841B, the efficiency of taking out light from the inside of the light emitting chip 840 is improved and the radiant energy, radiant flux, and radiant intensity of the light emitted from the light emitting device are also improved.

The light emitting device and the light emitting device adopted in the light emitting module according to the eighth and ninth embodiments are not limited to those described with reference to FIGS. 21 to 22, but various modifications may also be made. For example, the light emitting device may be made to have one of the configurations shown in FIGS. 23 to 27. Also in this case, the same operation and effect as in the previous light emitting device Z1 (refer to FIGS. 11 and 22) can be obtained.

Figure 24:
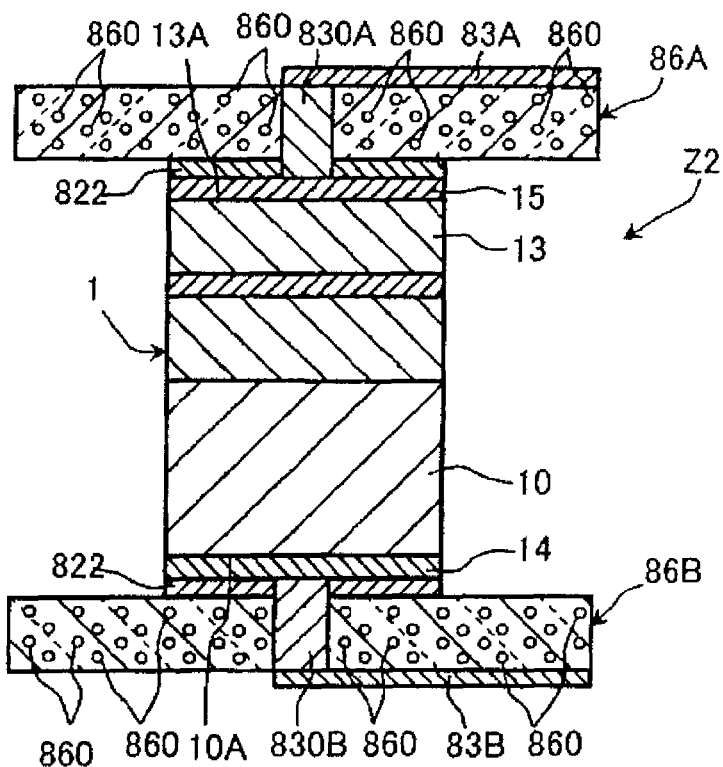
FIG. 24 is a longitudinal sectional view illustrating another example of a light emitting device according to the invention.
Figure 25:
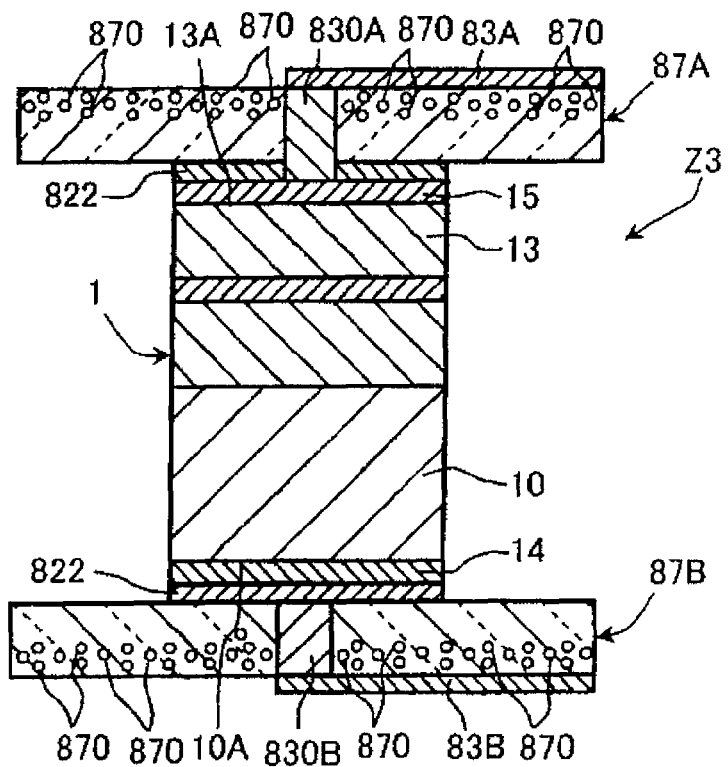
FIG. 25 is a longitudinal sectional view illustrating still another example of the light emitting device according to the invention.

In the light emitting devices Z2 and Z3 shown in FIGS. 24 and 25, fluorescence materials 860 and 870 are dispersed in first and second optical components 86A, 86B, 87A, and 87B. In the light emitting device Z1 shown in FIG. 24, the fluorescence materials 860 are dispersed in the entire first and second optical components 86A and 86B. In the light emitting device Z2 shown in FIG. 25, the fluorescence materials 870 are selectively dispersed on outer surface parts of the first and second optical components 87A and 87B.

The fluorescence materials 860 and 870 contained in the first and second optical components 86A, 86B, 87A, and 87B are selected according to the wavelength (color) of light to be emitted from the light emitting devices Z2 and Z3. For example, in the case where white light is emitted from the light emitting devices Z2 and Z3, a first fluorescence material that converts light emitted from the light emitting chip 1 into light having a peak of emission intensity in a wavelength range of 400 to 500 nm, a second fluorescence material that converts the light emitted from the light emitting chip 1 into light having a peak of emission intensity in a wavelength range of 500 to 600 nm, and a third fluorescence material that converts the light emitted from the light emitting chip 1 into light having a peak of emission intensity in a wavelength range of 600 to 700 nm are used as the fluorescence materials 860 and 870. As the first fluorescence material, for example, $(Sr, Ca, Ba, Mg)_{10}(PO_4)_6Cl_2$:Eu or $BaMgAl_{10}O_{17}$:Eu may be mentioned. As the second fluorescence material, for example, $SrAl_2O_4$:Eu or ZnS:Cu, Al or $SrGa_2S_4$:Eu may be mentioned. As the third fluorescence material, for example, SrCaS:Eu, $La_2O_2S$:Eu or $LiEuW_2O_8$ may be mentioned.

On the other hand, in the cases when the white light is emitted from the light emitting devices Z2 and Z3 by using the first to third fluorescence materials, for example, one that emits light having at least one peak of emission intensity in a wavelength range of 230 to 450 nm is used as the light emitting chip 1. As the light emitting chip 1, for example, a ZnO-based oxide semiconductor light emitting diode may be mentioned.

In addition, it may also be possible to make the light emitting devices Z2 and Z3 emit white light by using one that emits blue light as the light emitting chip 1 and using, as the fluorescence materials 860 and 870, ones that convert blue light into yellow light, for example, an yttrium aluminum garnet-based fluorescence material (YAG) activated by cerium (Ce) or an alkaline earth metal orthosilicate fluorescence material activated by bivalent europium (Eu).

Although the fluorescence materials 860 and 870 are contained in the first and second optical components 86A, 86B, 87A, and 87B in the light emitting devices 22 and Z3, the light emitting devices Z2 and Z3 are the same as the previous light emitting device Z1 (refer to FIGS. 21 and 22) in that the bottom surface 10A (first chip electrode 14) of the substrate 10 of the light emitting chip 1 and the top surface 13A (second chip electrode 15) of the p-type semiconductor layer 13 are covered by the first and second optical components 86A, 86B, 87A, and 87B formed of an inorganic material with the glass bonding member 822 interposed therebetween. Accordingly, also in the light emitting devices Z2 and Z3, the transmittances or mechanical strengths of the first and second optical components 86A, 86B, 87A, and 87B or glass bonding member 822 and fluorescence materials 860 and 870 and the luminous efficiency of the fluorescence materials 860 and 870 are suppressed from deteriorating. As a result, the radiant energy, radiant flux, and radiant intensity of the light emitted from the light emitting device Z is suppressed from being reduced even if the light emitting devices Z2 and Z3 are used for a long period of time.

In the light emitting device Z2 shown in FIG. 24, the first and second optical components 86A and 86B in which the fluorescence materials 860 are dispersed can be easily formed since the fluorescence materials 860 are dispersed in the entire first and second optical components 86A and 86B. That is, the light emitting device Z1 is advantageous in that the first and second optical components 86A and 86B can be easily manufactured.

In addition, in the light emitting devices Z3 shown in FIG. 25, the fluorescence materials 870 are selectively dispersed on outer surface parts of the first and second optical components 87A and 87B. By such a configuration, an optical path difference between light propagating horizontally through the first and second optical components 87A and 87B and light propagating in a direction inclined from the horizontal direction becomes small. As a result, since a difference in wavelength conversion amount between the light transmitted in the horizontal direction and the light transmitted obliquely is reduced, a part of light from the light emitting chip 1 is transmitted and the wavelength of the part of light is converted. Accordingly, in the case where a mixed color thereof is emitted, color unevenness is suppressed, which allows light having a uniform color to be emitted from the entire device.

It is needless to say that the light emitting devices Z2 and Z3 may be configured to emit light with a color other than the white color by appropriately selecting the types of the fluorescence materials 860 and 870 used. Alternatively, a wavelength conversion layer containing fluorescence materials may be provided on the outer surfaces of the first and second optical components 86A, 86B, 87A, and 87B instead of dispersing the fluorescence materials 860 and 870 in the first and second optical components 86A, 86B, 87A, and 87B.

Figure 26:
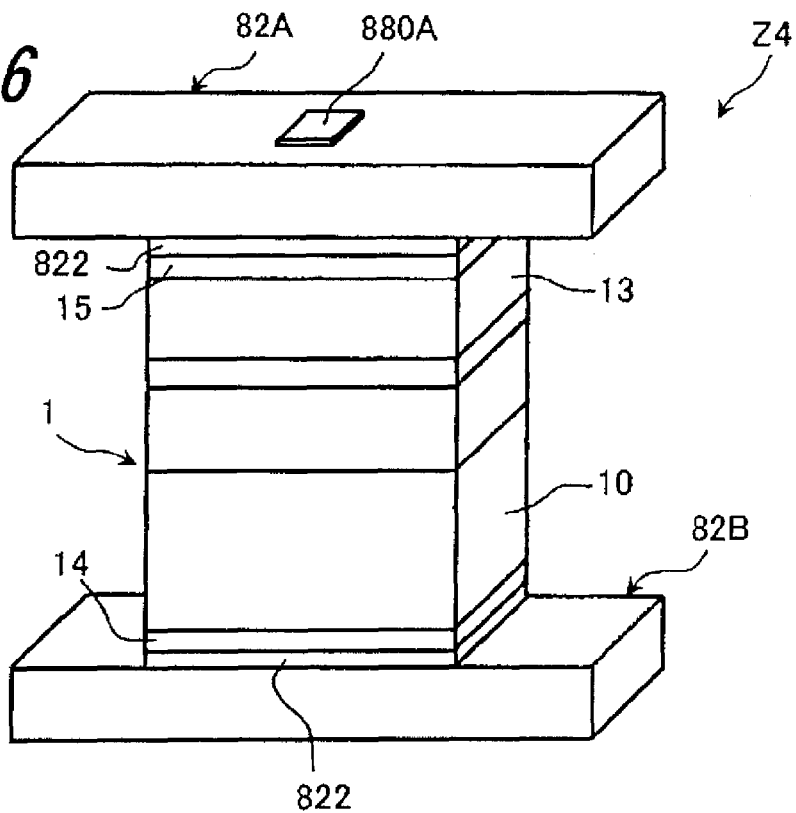
FIG. 26 is an entire perspective view illustrating another example of the light emitting device according to the invention.
Figure 27:
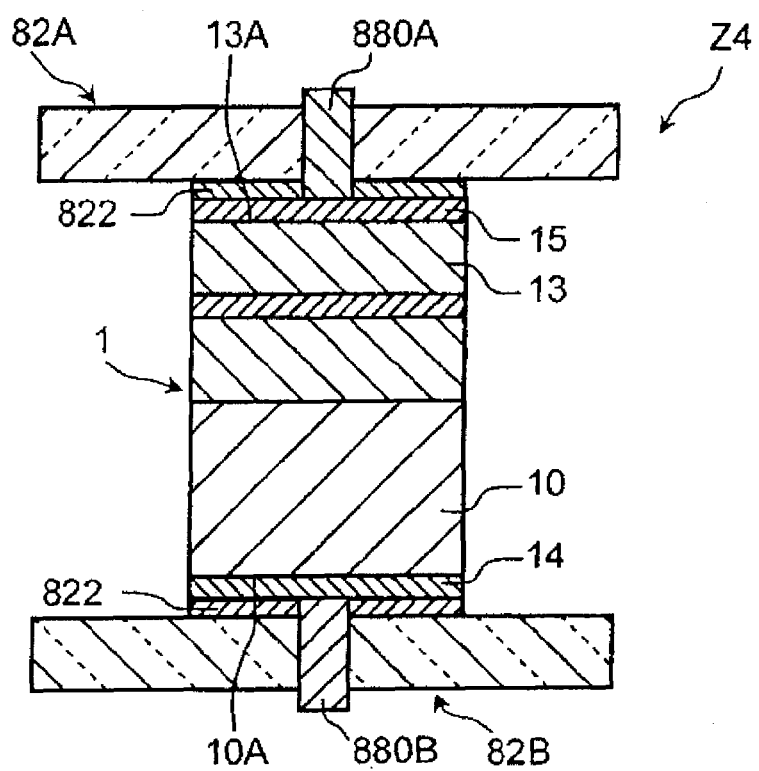
FIG. 27 is a longitudinal sectional view illustrating the light emitting device shown in FIG. 26.

The basic configuration of the light emitting device Z4 shown in FIGS. 26 and 27 is the same as that of the light emitting device Z1 (refer to FIGS. 21 and 22) described earlier, but the configurations of the first and second external connection terminals 880A and 880B are different from that in the light emitting device Z1 described earlier.

The first and second external connection terminals 880A and 880B pass through the optical components 82A and 82B and are directly conduction-connected to the first and second chip electrodes 14 and 15 of the light emitting chip 1. That is, the first and second relay conductors 830A and 830B (refer to FIGS. 21 and 22) in the light emitting device Z1 substantially function as the first and second external connection terminals 880A and 880B. However, parts of the first and second external connection terminals 880A and 880B protrude from the surfaces 821A and 821B of the first and second optical components 82A and 82B so that conduction connection between the first and second external connection terminals 880A and 880B and wiring lines in a mount board, such as a wiring substrate, is reliably made. It is needless to say that the first and second external connection terminals 880A and 880B are preferably exposed from the surfaces 821A and 821B of the first and second optical components 82A and 82B but do not necessarily need to protrude from the surfaces 821A and 821B of the first and second optical components 82A and 82B.

Although the shapes of the first and second external connection terminals 880A and 880B in the light emitting device Z4 are different from that in the previous light emitting device Z1, the light emitting device Z4 is the same as the light emitting device Z1 in that the bottom surface 10A (first chip electrode 14) of the substrate 10 of the light emitting chip 1 and the top surface 13A (second chip electrode 15) of the p-type semiconductor layer 13 are covered by the first and second optical components 82A and 82B formed of an inorganic material with the glass bonding member 22 interposed therebetween. Accordingly, also in the light emitting device Z4, deterioration of the first and second optical components 82A and 82B is suppressed, and the radiant energy, radiant flux, and radiant intensity of the light emitted from the light emitting device Z is suppressed from being reduced even if the light emitting device Z4 is used for a long period of time.

Also in the light emitting device Z4 shown in FIGS. 26 and 27, it is needless to say that fluorescence materials may be contained in the first and second optical components 82A and 82B, like the light emitting devices Z2 and Z3 shown in FIGS. 24 and 25. In addition, as the first and second optical components 82A and 82B, one whose surface is a curved surface, for example, a lens-shaped member may also be adopted without being limited to one having a plate shape.

EXPLANATION OF REFERENCE NUMERALS

X1: Light emitting device
1: Light emitting chip
10: Substrate (of Light emitting chip)
11: N-type semiconductor layer (of Light emitting chip) (First conduction type layer)
12: Light emitting layer (of Light emitting chip)
13: P-type semiconductor layer (of Light emitting chip) (Second Conduction Type Layer)
2: Optical component
20: Container
21: Lid
23: Upper opening of (Container)
4: Glass bonding member

The invention claimed is:

1. A light emitting device comprising:
a container formed of a transparent inorganic material and having a recessed opening;
a light emitting chip disposed in the recessed opening of the container with a glass bonding member interposed therebetween, the light emitting chip comprising:
a substrate,
a first electrode which is formed on a bottom surface of the substrate, and
a first conduction type layer, a light emitting layer, a second conduction type layer, and a second electrode which are all formed on a top surface of the substrate so that the first conduction type layer, light emitting layer, second conduction type layer, and second electrode are stacked on top of one another;
a lid formed of a transparent inorganic material and sealing the recessed opening of the container;
a first external connection conductor passing through a low wall of the container and being electrically connected to the first electrode of the light emitting chip; and
a second external connection conductor passing through the lid and being electrically connected to the second electrode of the light emitting chip.

2. The light emitting device of claim 1, wherein the light emitting chip is bonded to an inner surface of the container with the glass bonding member interposed therebetween.

3. The light emitting device of claim 2, wherein the lid is bonded to the light emitting chip with a glass bonding member interposed therebetween and seals the recessed opening.

4. The light emitting device of claim 2, wherein a refractive index of the glass bonding member is smaller than that of the container or the lid.

5. The light emitting device of claim 1, wherein the container includes a tubular component, having a penetration space in which the light emitting chip is disposed, and a mount substrate sealing an opening of the tubular component and on which the light emitting chip is mounted.

6. The light emitting device of claim 1, wherein one or a plurality of fluorescence materials which convert a wavelength of light emitted from the light emitting chip exist on an outer surface part of the container or an outer surface part of the lid.

7. A light emitting module comprising:
an insulating substrate; and
the light emitting device of claim 1 mounted on the insulating substrate.

8. A light emitting device comprising:
a light emitting chip comprising:
a substrate,
a first electrode which is formed on a bottom surface of the substrate, and
a first conduction type layer, a light emitting layer, a second conduction type layer, and a second electrode which are all formed on a top surface of the substrate so that the first conduction type layer, light emitting layer, second conduction type layer, and second electrode are stacked on top of one another;
a first optical component bonded to the first electrode of the light emitting chip with a bonding member formed of an inorganic material interposed therebetween, the first optical component formed of an inorganic material and having a transparency;
a second optical component bonded to the second electrode of the light emitting chip with a bonding member formed of an inorganic material interposed therebetween, the second optical component formed of an inorganic material and having a transparency;
a first relay conductor passing through the first optical component and being electrically connected to the first electrode;
a second relay conductor passing through the second optical component and being electrically connected to the second electrode;
a first external connection electrode formed on a surface of the first optical component and electrically connected to the first relay conductor; and
a second external connection electrode formed on a surface of the second optical component and electrically connected to the second relay conductor.

9. The light emitting device of claim 8, wherein a refractive index of the glass bonding member is smaller than that of the light emitting chip, and a refractive index of the optical component is larger than that of the glass bonding member.

10. The light emitting device of claim 8, wherein one or a plurality of fluorescence materials which convert a wavelength of light emitted from the light emitting chip exist on an outer surface part of the first and second optical components.

11. A light emitting module comprising:

an insulating substrate; and the light emitting device of claim 8 mounted on the insulating substrate.

* * * * *